United States Patent [19]
Grover

[11] Patent Number: 5,361,277
[45] Date of Patent: Nov. 1, 1994

[54] METHOD AND APPARATUS FOR CLOCK DISTRIBUTION AND FOR DISTRIBUTED CLOCK SYNCHRONIZATION

[75] Inventor: Wayne D. Grover, Edmonton, Canada

[73] Assignee: Alberta Telecommunications Research Centre, Canada

[21] Appl. No.: 331,635

[22] Filed: Mar. 30, 1989

[30] Foreign Application Priority Data

Apr. 27, 1988 [CA] Canada .................................. 565,292

[51] Int. Cl.[5] .............................................. H04L 7/00
[52] U.S. Cl. .................................. 375/107; 327/141; 327/144; 327/292
[58] Field of Search ................... 375/36, 38, 106, 107, 375/118, 10; 455/27, 49, 51; 328/55, 58, 72; 370/108; 371/1; 307/262, 511

[56] References Cited

U.S. PATENT DOCUMENTS

| | | | |
|---|---|---|---|
| 4,481,647 | 11/1984 | Gombert et al. | 375/107 |
| 4,761,799 | 8/1988 | Arragion | 375/107 |
| 4,862,158 | 8/1989 | Keller et al. | 375/107 |
| 4,998,262 | 3/1991 | Wiggers | 375/107 |

*Primary Examiner*—Stephen Chin
*Attorney, Agent, or Firm*—Hayes, Soloway, Hennessey, Grossman & Hage

[57] ABSTRACT

A method and apparatus of phase synchronizing a plurality of spatially distributed application modules having synchronizing clocks requiring synchronization, each application module being connected, at a predetermined site nearest the module, to an outgoing path and, at a corresponding site nearest the module, a return path of a pulse reference path, the method comprising the steps of injecting reference pulses at a predetermined frequency into an injection site of the reference path such that the pulses travel along the outgoing path to a remote site and return to the injection site along the return path; determining, for each application module, the time interval for each pulse to travel from the predetermined site to the corresponding site associated with the application module; monitoring, for each application module, the elapsed time interval for each pulse to travel between the predetermined and corresponding sites associated with the application module; producing, for each application module, a local phase reference signal when the elapsed time interval is one-half a last determined one of the time intervals; and synchronizing the clock of each application module with the local phase reference signal.

54 Claims, 12 Drawing Sheets

METHOD AND APPARATUS FOR CLOCK DISTRIBUTION AND FOR DISTRIBUTED CLOCK SYNCHRONIZATION

The present invention relates to a method and an apparatus for phase synchronizing spatially distributed application modules requiring synchronization.

BACKGROUND OF THE INVENTION

In the telecommunications industry and the computer industry, leading manufacturers are continuing to develop equipment designs employing increased clock rates while simultaneously pursuing architectures with hundreds and even thousands of distributed machine elements. These elements may be, for example, periphery interface modules, time-switch modules in a digital switching machine, individual processor elements in a "connectionist" type machine, pipeline floating point logic units in an array processing supercomputer, or systolic array processors for signal processing or radar applications.

For maximum performance and efficiency in these applications, each equipment module requires a clock signal that is phase-synchronous with the clock in every other module. The clocking of every element of the machine synchronously at the highest possible rate provides the best chance of approaching system speeds equal to the switching speeds of individual logic elements of the technology employed.

Whether the processing modules involved are circuit packs, meters apart running at 50 Mhz, or subcircuits of a wafer-scale VLSI system, millimeters apart running at GHz, the basic problem is that of "clock distribution" to a large number of state devices distributed over a distance where propagation delays are a significant fraction of the clock period, extending even to multiples of the clock period.

The conventional engineering approach to clock distribution is hierarchical with a tree of increasing fanout at each stage. In this method, a central clock source is distributed either by electrical or optical transmission media though a tree-like structure with each device to be synchronized terminating one leaf of the tree. Intermediate branches of the tree buffer and split the signal incoming to them into a larger number of copies of the signal with which they drive subsequent branches in the tree. The limitations and problems of this approach are well-known but to date have been dealt with through careful and conservative design. Some of the undesirable problems of hierarchical clock distribution are:

1. A significant fraction of total system power consumption can be dissipated in the many clock-driver buffers and transmission lines present in total throughout the system.
2. High pinout count and extensive track layout exist. Usually, balanced transmission is necessary requiring two pins at each end and two tracks per clock signal. Impedance controlled track layout may be necessary, often requiring expensive design iterations. High pin-count impacts cost, size and MTBF of the equipment design.
3. For large fanout, with any given technology, the number of hierarchical levels required increases as $\log_n(N)$ where n is the fanout per stage and N is the total system population. Each expansion stage is the source of increased clock skew.
4. In-service growth of a system using hierarchical clock distribution can be limited or impossible unless initial provision was adequately made within the clock distribution tree to accommodate new modules without exceeding wiring limits, power limits or maximum skew limits.
5. Hierarchical electrical clock distribution makes a machine design particularly apt to emission at the clock rate or its harmonics that may exceed FCC requirements. If so, expensive redesign or shielding may be required. In addition, long electrical clock distribution paths sometimes lead to electromagnetic susceptibility problems.

Accordingly, present system designs that use hierarchical clock distribution rely critically on the control of wiring lengths and track layout and, ultimately on the limiting of clock rates, as the means to minimize clock skew and to obtain adequate margins against the remaining clock timing variations due to varying loads on fanout devices and device-to-device speed variations in the various branches of the clock distribution tree. The clock skew in such systems often limits the usable clock rate to well below the clock rate that would be usable if the system were limited by the operating times of the logic circuits themselves.

Recently the problem of low-skew high fanout clock distribution has also been treated as a limiting factor on the speed of operation of VLSI circuits.

With conventional clock distribution systems on VLSI, the high fanout clock drivers consume significant circuit area and power and the clock distribution lines that they drive require well isolated low resistance tracks to avoid crosstalk and to control clock signal loading. Such clock distribution lines again consume significant circuit area, particularly if all track lengths are to be equal for minimal skew. Holograms for clock distribution have been proposed but many development problems including mechanical stability over time and temperature must be solved to the level required to suit coherent optical techniques before this approach could be viable.

The specific synchronization problem addressed here is to be distinguished from some related problems and methods in the area of distributed hierarchical timing control. There are several schemes which use similar terminology but actually address only the problem of distributed frequency lock without a requirement for the control of absolute phase. It is to be noted that the terms "absolute" time and phase used herein are with respect to an imaginary perfect clock in the same rest frame as the entire distributed system under consideration. Perfect Synchronization conceptually means that if one could view every clock in the system from one point without the speed of light delay in observation, every clock would appear in step. In practice, perfect synchronization means that if every system clock were connected to an oscilloscope through probes of precisely equal delay, then each trace on the scope would align and each clock taken individually will show the identical phase with respect to one designated master clock.

The phase synchronism of a group of clock signals at spatially distributed locations is characterized by the skew of the system. Skew is defined as the absolute value of the maximum variations, over a distributed phase-synchronous system, of the time at which the active edge of the distributed clock makes its transition at each of the locations requiring the clock signal.

Loop-timing of remote equipment communicating with a telecommunications central office digital switch is a common application in which it is desired that a given channel bank (or other interface equipment) will sample and multiplex the speech waveforms (or data) at its site with the same 8 KHz frequency that is used at the central office. This method avoids speech sample "slips and repeats" that occur if the channel bank were to freerun on its own 8 KHz frame rate. "Loop timed synchronization" is achieved when the remote equipment derives its internal sampling frequency for the high speed bit-timing information received from the transmission signal received by that equipment from the central office.

This loop timing does not address the aforementioned problems because it does not control the absolute phase of the synchronized equipment clock with respect to any other equipment that is similarly loop timed from the same source. If a large number of devices were loop timed from one central hub by this method, their internal clocks would be of the same frequency but the phase skew of this system would be uncontrolled unless the propagation delay to each site was equalized, in which case, this reduces to hierarchal timing distribution using clock extraction from the data signal in place of direct clock distribution.

In telecommunications, it is known to synchronize central office switching machines in order to provide multi-trunk transmission without introducing slips or repeats through digital switching. This is a distributed synchronization situation, but, once again, requires frequency synchronization only and is addressed by a variation of hierarchical clock distribution from one or more central references via loop timing of subordinate central offices, downwards in a tree.

The reviewer in this area may also find reference to "mutual synchronization" schemes in which two or more central office clock controllers exchange phase wander (low frequency drift) information measured between their own clocks and the clocks received from their neighbours. The mutually-synchronizing offices repeatedly average the error values fed back from their neighbours and adjust the frequency of their own clocks slightly in accordance with the phase drift rates with respect to their neighbours. In this manner, a network of central offices can become mutually frequency synchronized. They may further be locked to the wider network by injecting a master reference at a designated site. Once again, however, this method achieves frequency lock amongst a number of distributed sites, but does not control the phase of the clocks at each site. For all phases to be nominally equal at equilibrium of the mutual synchronization net, the propagation delay between all nodes would once again have to be controlled.

Another class of synchronization problems involves distributed synchronization amongst a network of devices for the purpose of coordinated (contention free) access to a shared transmission medium. Canadian Patent No. 1,158,739 entitled "Distributed Synchronization System" is an example of such a system. According to this patent, a number of active communicating devices are attached to a linear bi-directional trunk and branch transmission topology (the CATV network topology to be precise) and employs time division burst multiplexing for communications between the distributed stations and a head-end master site. The head-end controller transmits toward all sites in a continuous TDM format from which all remote sites extract their bit clock, the TDM frame timing at their location, and the payload data for the location. However, a different method is required for upstream transmission and bunt mode TDM is used.

To avoid collisions when the remote sites transmit upstream, the controller maintains a coarse form of synchronization amongst the dependant stations through a continuously active process of adaptive delay adjustment. The method proceeds as follows: The controller times the interval between sending its message and receiving a response as a means to deduce the time-of-flight delay from the site to the head-end. The controller then downloads a delay-adjust value to that remote unit so that, in conjunction with the downstream TDM frame reference, transmissions from that site are timed to avoid collision. When all remote sites are so delay adjusted, an upstream synchronization order is established.

Although there may appear superficial similarities between this scheme and the present invention, this scheme is different in both method and objective from the present invention. First it does not seek to attain, nor does it attain, phase synchronism of the high speed clock at the distributed sites nor does it seek to attain distributed frame synchronization to a timing accuracy that would permit the local generation of a frequency/phase locked high speed clock. The scheme only achieves a level of synchronization necessary to coordinate transmission bursts without collision. Several whole-bit guard bands of time are still required at the start and end of each burst. Second, continuous active control is required to continually update an adjustment to each remote site with at least three message transactions per update. The system crashes if this polling/update processor fails or falls behind. As will become clearer later, the method of the present invention involves no messaging, no central control and no computer processor of any type. Third, the latter scheme distributes the master-rate clock directly in addition to messaging to coordinate time-of-flight measurement and compensation. The present invention has neither of these requirements. Fourth, the latter scheme performs its intended function in a trunk and branch (CATV-type) architecture. The present invention is considerably simpler but is intended only for operation with a synchronization trunk transmission layout that has no branch stubs. The inherent round-trip delay-halving mechanism of The present invention only works as intended if all synchronized points are on the main trunk of the synchronizing paths.

SUMMARY OF THE INVENTION

The present invention provides a novel method and apparatus to provide an economical, maintainable, compact and reliable alternative technique for phase-synchronous low-skew clocking of a large number of state devices (i.e. logic circuits) in digital systems where the signal propagation time between modules is large with respect to the required clock accuracy. Immediate applications exist, but are not limited to, the clocking of large computers or digital switching machines having several racks of equipment distributed over a room-sized space, computers or digital switching machines having several racks of equipment distributed over a room-sized space at clock rates over 20 MHz. Other applications include clock distribution in very large scale integrated circuits or wafer-scale VLSI.

More specifically, the present invention seeks to provide precise control of the phase of a high speed distributed clock and, by implication, also achieve frequency synchronization.

As commonly stated, the problem under consideration is the distribution of a clock signal to all of the circuit modules of a distributed system such that the clock available to each module is in phase with all other clock signals in the system to within some specifiable time error, called the skew. However, this statement of the problem assumes that the solution somehow involves the physical distribution of the desired clock signal and this limits the actual solutions that are possible.

However, the real objective according to the present invention involves phase-synchronized clocking of all modules and does not necessarily require the direct distribution of actual clock signals to each module through some central clock source. According to the present invention, there is provided an arrangement whereby spatially distributed modules recognize one (or more) absolute moment(s) in time as a common (arbitrary) reference time. Stated differently, the arrangement conveys information about the phase of the desired clock to all stations rather than directly distributing a clock of the appropriate phase to all sites. Accordingly, this invention transforms the problem into one of achieving a common absolute time reference that is identical in time at a number of locations, regardless of position, without resorting to direct fanout of a delay-equalized path to each module. The absolute time reference, having been derived by all modules, then provides the required local information to adjust the phase of each local (phase-locked) clock generator.

In accordance with one aspect of the present invention, there is provided a method of phase synchronizing a plurality of spatially distributed application modules having synchronizing clocks requiring synchronization, each application module being connected, at a predetermined site nearest the module, to an outgoing path and, at a corresponding site nearest the module, to a return path of a pulse reference path, the method comprising the steps of:

injecting reference pulses at a predetermined frequency into an injection site of the reference path such that the pulses travel along the outgoing path to a remote site and return to the injection site along the return path;

determining, at each application module, the time interval for each reference pulse to travel from the predetermined site to the corresponding site associated with the application module;

monitoring at each application module the elapsed time interval for each reference pulse to travel between the predetermined and corresponding sites associated with the application module;

repeatedly producing, at each application module, a local phase reference signal when the elapsed time interval is one-half a last determined one of the time intervals; and synchronizing the clock of each application module with the local phase reference signal.

In accordance with another aspect of the present invention, there is provided a synchronous clock distribution apparatus for providing a common absolute time reference to spatially distributed application modules requiring synchronized clocks. The apparatus comprises means for producing a series of reference pulses at a predetermined frequency, means defining a pulse reference path including an outgoing path for transmitting the series of pulses from the producing means to a remote site and a return path for transmitting the series of pulses from the remote site back to the producing means, and means for connecting each application module to the pulse reference path at intermediate spatially distributed sites along the reference path, the connecting means including an interval-halving circuit means for producing a local phase reference signal representative of one half of the time interval for a pulse to travel from a site on the outgoing path to a corresponding site on the return path.

In accordance with still another aspect of the present invention, there is provided a circuit for producing a clock signal which is phase aligned with a reference signal injected at an injection site into a reference path having outgoing and return paths connected together at a site remote from the injection site and of substantially equal lengths. The circuit comprises detector means adapted to be connected at a predetermined site on the outgoing path and a corresponding site on the return path of the reference path for producing a predetermined output signal when a reference signal is travelling from the predetermined site to the corresponding site, a voltage controlled oscillator having an input and an output and being adapted to produce an oscillator output signal at a frequency and phase determined by a voltage applied to the oscillator input, divider means adapted to receive the oscillator output signal for producing POSITIVE and INVERTED output signals, and means adapted to receive the POSITIVE and INVERTED output signals and the predetermined output signal for applying to the input of the voltage controlled oscillator a voltage proportional to the deviation of the transition between the POSITIVE and INVERTED output from the center point of the predetermined output signal.

BRIEF DESCRIPTION OF THE DRAWINGS

These and other features of the invention will become more apparent from the following description in which reference is made to the appended drawings, wherein:

FIGS. 3a–3h are waveform diagrams of the signals at various points in the circuit of FIG. 3;

DESCRIPTION OF PREFERRED EMBODIMENTS

Figure 1:
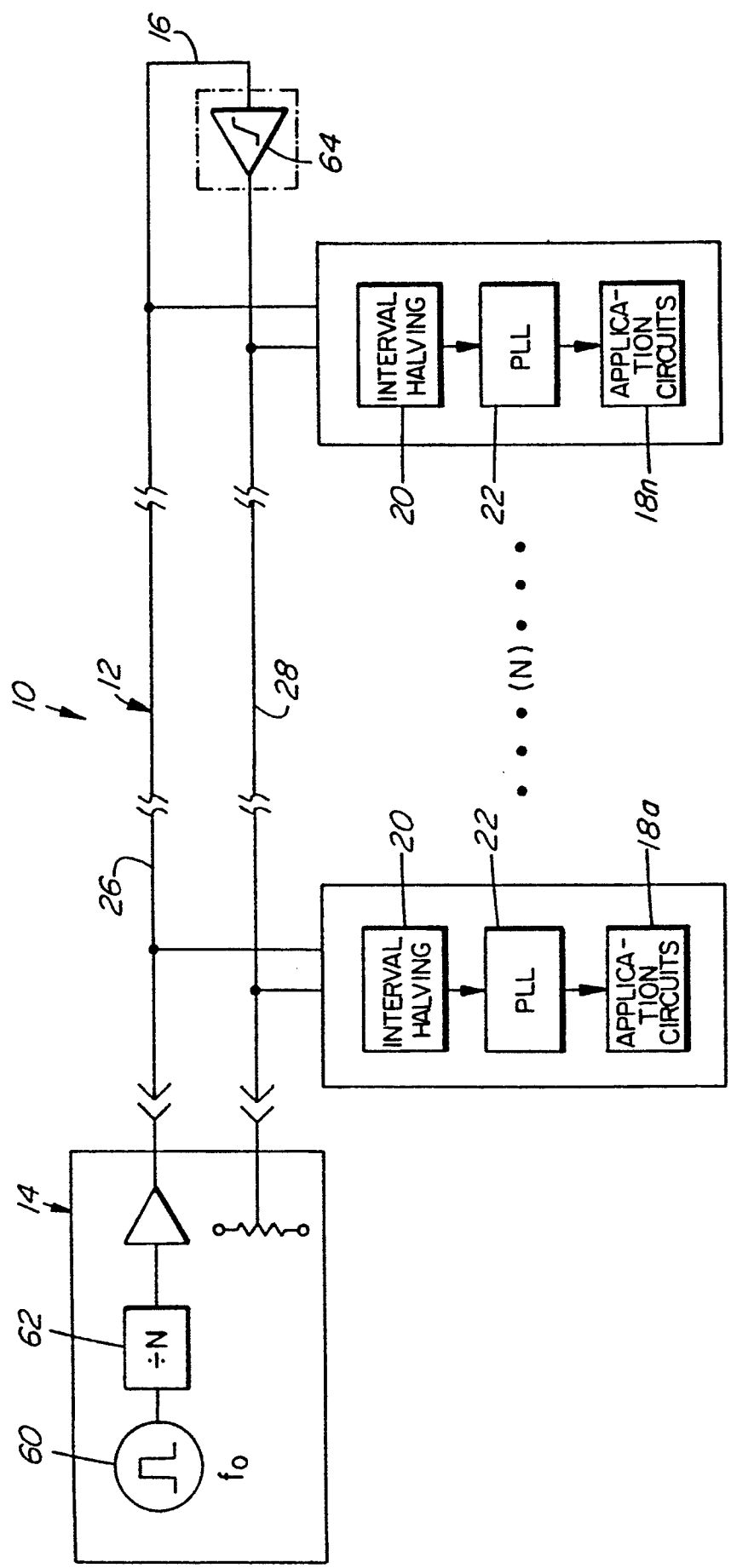
FIG. 1 is a schematic illustration of a distributed clock synchronization system according to the present invention.

With reference to FIG. 1 of the drawings, the present invention, generally designated by reference numeral 10, will be seen to be comprised of a traveling-pulse synchronization reference path 12, a pulse injector circuit 14, a synchronization Path Loop (with optional regeneration) 16, application circuits 18a–18n requiring synchronized clocks, an interval-halving circuit 20 (one per module to be synchronized), and local clock phase locked loops 22 (one per module to be synchronized).

The common time reference required to maintain clock synchronization through phase-lock control of the individual module oscillators is provided in the simplest form of the present invention as follows. A discussion of variations and enhancements will follow.

Figure 2:
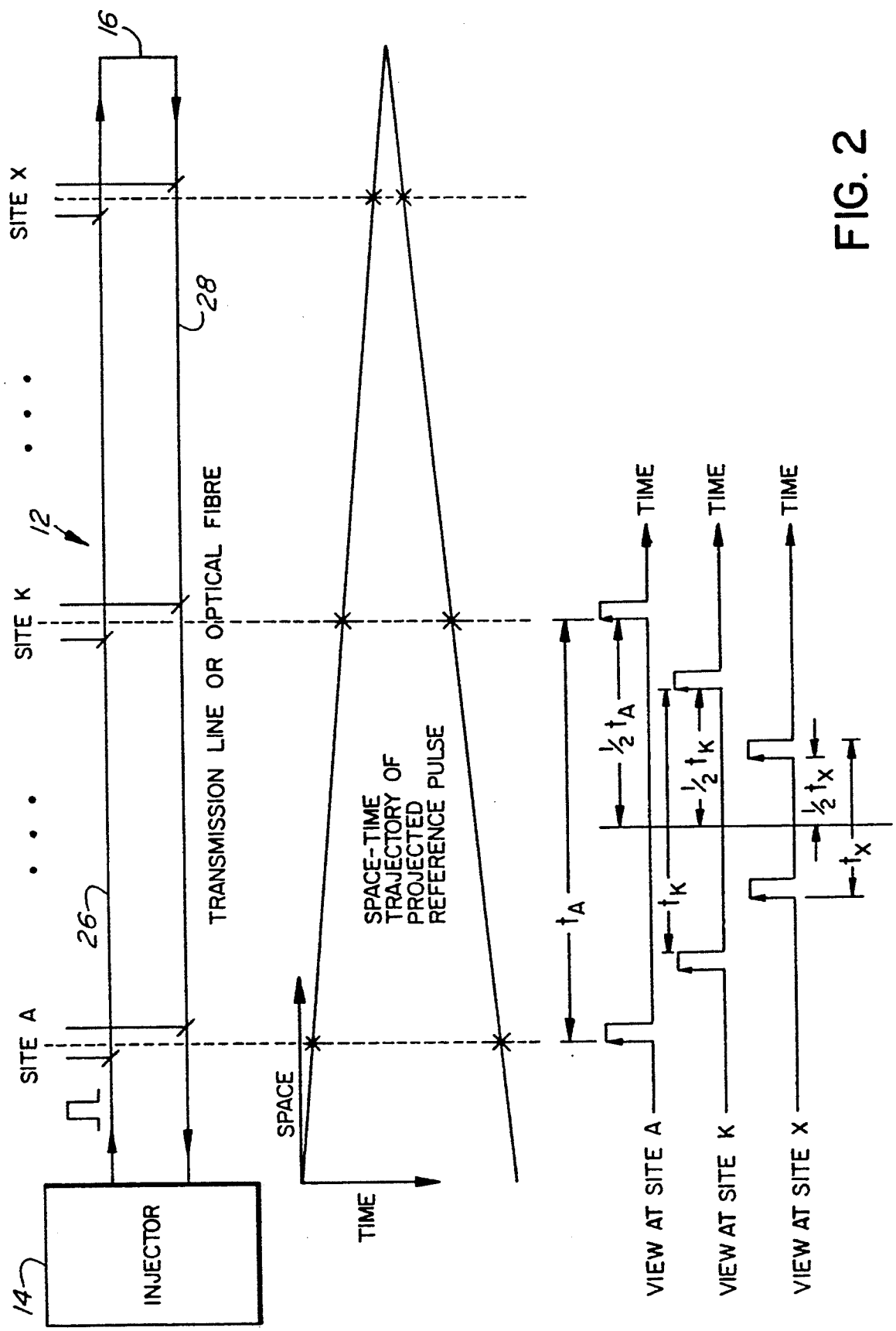
FIG. 2 is a view similar to FIG. 1 but including a space-time trajectory of a projected reference pulse.

With reference to FIG. 2, pulse injector circuit 14 drives the reference path loop 12 with an isolated square pulse, or other reference pulse which may have desirable properties in this application. The reference pulse travels from left to right in FIG. 2 and is looped back at 24 at the right hand side of the figure. The end-loop causes the pulse to return to the injector site where it is terminated. The down and back transmission paths 26 and 28, respectively, are physically routed together as one pair of conductors having virtually equal go and return lengths from any point to the end loop 24 and are routed through the location of every module to be synchronized.

Each module to be synchronized taps both the down path once and the return path once at the location nearest that module on the synchronizing path. Such tapping is temporarily assumed to be without effect on the travelling pulse shape to the extent that all modules will trigger recognition of the travelling pulse at the same point on the pulse characteristic when it passes their location, regardless of module position.

With the arrangement so far described, each time the reference pulse injector drives the synchronizing path, every module detects the travelling reference pulse once on its way down and once on its way back. If the pulse injector repeatedly stimulates the synchronization path at an interval greater than the round-trip propagation time, then, from consideration of the space-time trajectory of the travelling pulse shown in FIG. 2, there is sufficient information available to all modules with which to repeatedly derive an arbitrary but common absolute time reference to which all can repeatedly adjust the phase of their local clock to maintain the desired system-wide phase coherent synchronization. FIG. 2 indicates that the procedure for each site to derive the system-wide time references is to halve the time interval between the down pulse detection and the return pulse detection as seen at the position of any given module.

Figure 3:
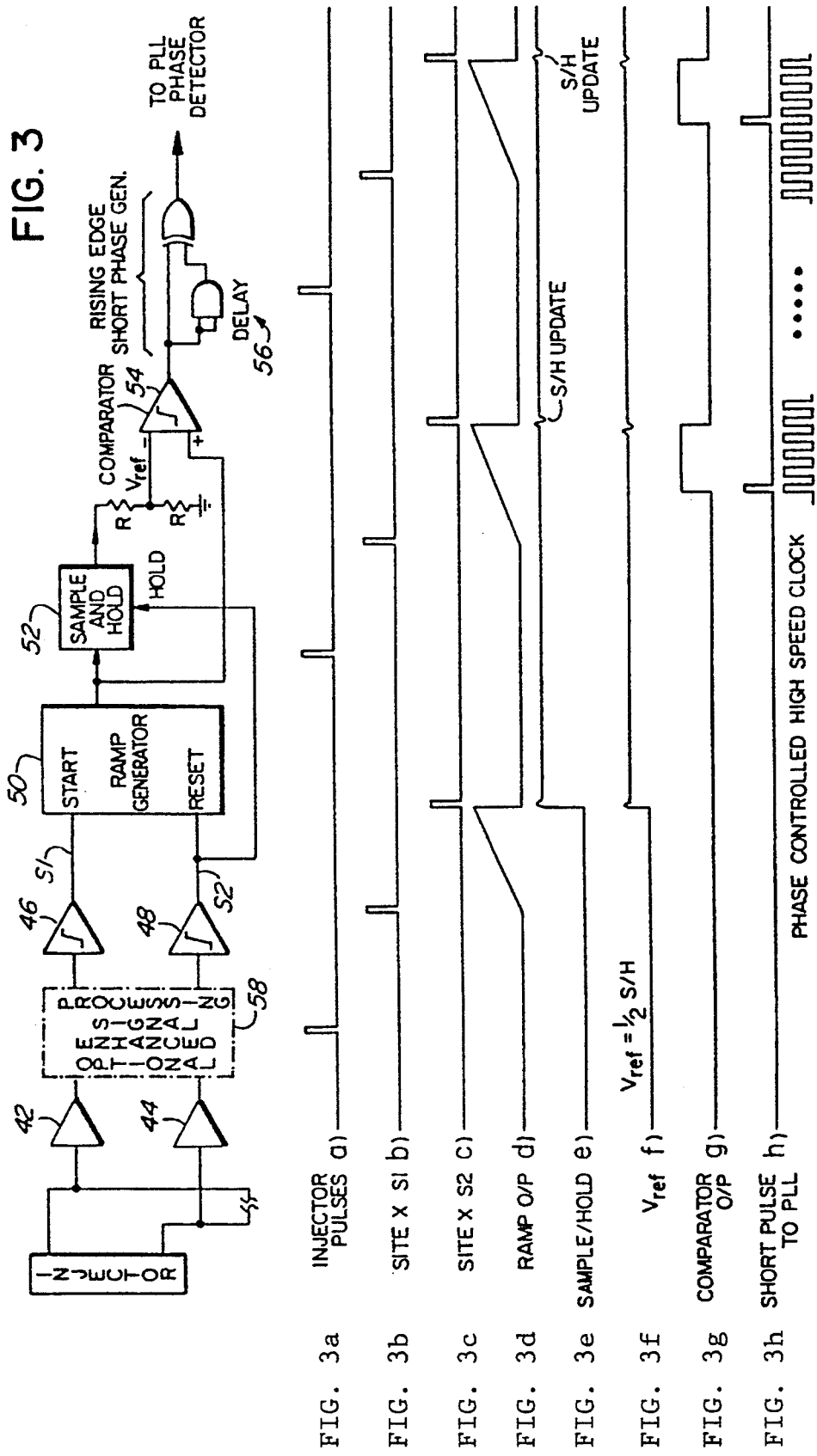
FIG. 3 illustrates a circuit for generating the local interval-halving pulses at each module.

FIG. 3 illustrates a circuit 40 for generating the local interval-halving pulses at each module which, according to the method of the present invention, will be in exact temporal coincidence with the local interval-halving pulses generated in every other module although no other signal occurs simultaneously in the system. By repeatedly pulsing the reference loop at a period that is an integral number of clock cycles of the stable master clock associated with the pulse injector, each module in the system will derive a series of interval-halving system-wide time references as shown by the waveform in FIG. 3h. Depending on the system distance and the inherent phase lock loop oscillator stability, this train of phase-reference pulses can be of sufficient frequency and phase coherence with the master oscillator to phase-lock all of the individual module phase lock loop clock-generators to within a desired maximum skew.

FIG. 3 illustrates one form of a circuit that performs the function of interval-halving as required according to the present invention. After two down-and-back timing pulse injections, one reference phase is obtained and every subsequent timing pulse injected by the pulse injector creates another local phase reference pulse out of the interval-halving circuit. Using this interval-halving circuit, a conventional phase lock loop can be used to lock onto the reference pulses derived from the interval-halving process.

Buffer circuits 42 and 44 monitor the down and back transmission paths, respectively. The injector pulses in FIG. 3a, FIG. 3b, and FIG. 3c illustrate pulses seen at arbitrary sites A, K, X on the outgoing and return path, respectively. Buffer circuits 42 and 44 may be high-impedance voltage followers if coaxial cable is used or they may be photodiode or other optical detector circuits if tapped optical fibers are used for the synchronization reference path. In the simplest instance, these interface circuits are followed by precision threshold detectors 46 and 48 and the output from the threshold devices is fed to the remaining interval-halving circuitry. More advanced time-detection signal processing is discussed later.

The outputs of the threshold detectors 46 and 48 are pulses denoted s1 and s2. s1 corresponds to a down-direction travelling pulse detection and s2 corresponds to the returning pulse detection seen at this module location. s1 enables a RAMP GENERATOR 50 which produces a linear voltage rise as shown in FIG. 3d until pulse s2 is received. When pulse s2 occurs, a SAMPLE AND HOLD GATE 52 operates to acquire and hold the ramp voltage corresponding to s2 as shown in FIG. 3e. The ramp generator is then reset, ready for the next s1–s2 pair.

After one pair of s1–s2 pulses, SAMPLE AND HOLD GATE 52 hold the final ramp voltage reached during that s1–s2 interval. This voltage forms a local measure of time duration, in arbitrary units. In the next s1–s2 interval, the ramp voltage for that interval is compared, as it rises, to one half the peak ramp value attained in the previous interval (currently held on SAMPLE AND HOLD GATE 52) by a COMPARATOR 54. The comparator produces a switching transition halfway through the current s1–s2 interval as shown in FIG. 3g. The rising edge of this transition is converted into the required narrow pulse by SHORT PULSE GENERATOR 56 the output wave form of which is illustrated in FIG. 3h and is used as the reference phase input to the phase detector of a phase-locked-loop (not shown) which may use a 4044 type phase detector logic to −90 degrees. This is referred to as a single-quadrant phase shifter. Many other phase-shift circuits are known which will provide from one (90 degree) to four (360 degree) quadrant phase shift characteristics. Depending on the phase shift range available, a limit is placed on the range of a system of the type shown in FIG. 7 as follows, in addition to the performance characteristics discussed earlier for any system using the two-pass propagation principle for time-reference derivation. This constraint is:

$$D < = (r/4)*(v/f_0) \text{ for } r < = 4$$

$$D < = \text{infinity for } r > 4$$

where r=phase-range/($\pi/2$) and is the fractional number of quadrants covered. D is infinity for r>4 because in such a case, the phase control circuit is able to shift any raw clock phase back into the desired system-wide reference phase. V is the velocity of propagation described above.

Figure 8A:
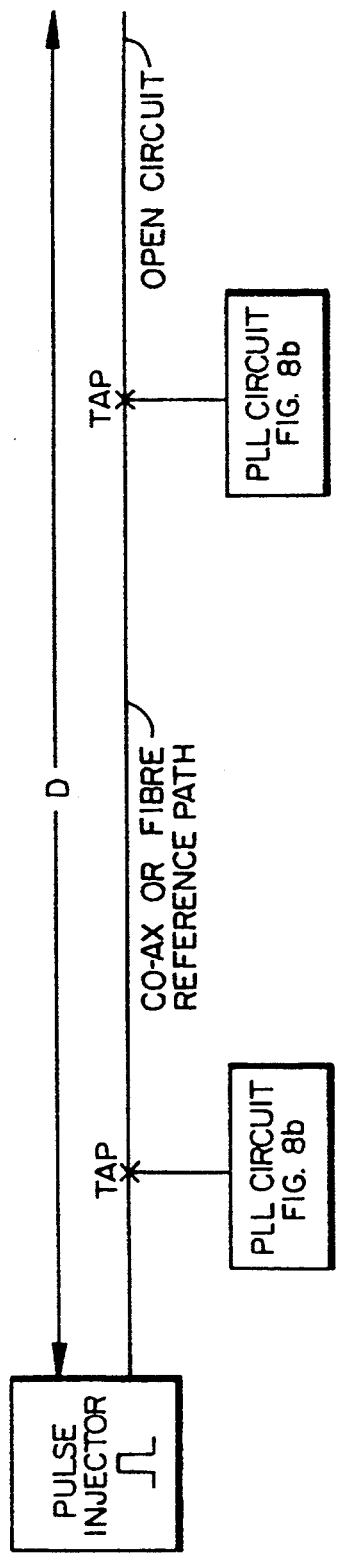
FIGS. 8a–8c illustrate the circuit of FIG. 4 adapted to achieve the same synchronization objective using only a single physical conductor to provide both directions of reference pulse travel and satisfying certain constraints under which an interval-halving ambiguity of the one conductor embodiment is rendered harmless.

With the benefit of the description of this invention so far given, it is of practical value to consider implementation on a single reference path conductor. The obvious problem to be overcome is the separate identification of P1 (down) and P2 (returning) pulses if they both occur on one medium seen at the synchronization sites with one tap, as shown in FIG. 8a. P1 and P2 pulses have to be uniquely identified in the invention as revealed so far so that the correct interval is halved by all sites, i.e. $P1_n - P2_n$, not $P2_n - P1_{n+1}$ where n denotes the nth injected reference pulse. A number of methods are possible within the scope of this invention to resolve this potential ambiguity so that the intended $P1_n - P2_n$ interval is used as the reference; the peak level of the returning P2 pulses may often be lower than P1 (outgoing) pulses thereby permitting discrimination; the polarity of P2 pulses may be opposite to P1 pulses (i.e. if a short circuit is used at distance D in FIG. 8a to return the reference pulse when coaxial cable is used); direction-sensitive coupling may discriminate P1 from P2 pulses at the tap point (especially if fiber is used); or the $P2_n - P1^{n+1}$ may be deliberately increased in duration by lowering $F_{inject}$, so as to permit a monitor circuit at each site to discriminate $P1_n - P2_n$ pairs from $P2_n - P1_{n+1}$ pairs based on a duration threshold criteria.

However, a preferred system configuration is possible which is part of this invention. This solution is more elegant and attractive in practice because it avoids the need for any of the above measures by ensuring that the ultimate objective, (phase control of the application clock fo to within the desired skew) is achieved, even if the PLL initially locks onto the $P2_n - P1_{n+1}$ interval rather than the apparently essential $P1_n - P2_n$ interval. It can be shown however, that the desired phase synchronous clock control is achieved regardless of the interval halving ambiguity if the condition $1/f_{pulser} = 2n/f_0$ is met ($f_0$ = the application clock).

Figure 8C:
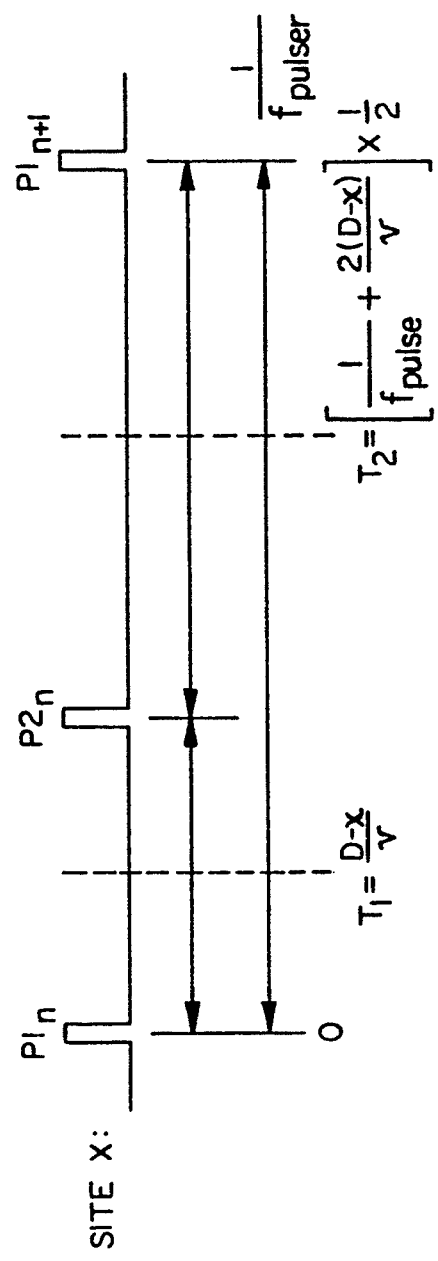

To see this, consider a site at position x on the reference path, measured from the injector site as in FIG. 8c. The originally intended switching time $T_1$ corresponding to the $P1_n - P2_n$ interval is $T_1 = (D - x)/v$ measured with respect to the time of P1 at x. Now if the other interval halving mode of operation should happen to be adopted when the PLL is initially locked on, the actual interval halving time will be obtained from the $P2_n - P1_{n+1}$ interval:

$$T_2 = [(1/F_{pulser}) + 2(D - x/v)] \cdot \tfrac{1}{2}$$
$$= 1/f_{pulser} + (D - x/v)$$

The time difference from $T_1$ to $T_2$ is $\tfrac{1}{2}f_{pulser}$.

Because the concern is with the phase skew of the application clock derived from the $T_1$ or $T_2$ instants in time, not with the absolute times of $T_1$ or $T_2$ themselves, we require only that $T_2 - T_1$ be itself a whole number of clock cycles at the application rate since the phase skew of the application clock is identical whether the clock locks to $T_1$ or $T_1 + n/f_0$, where n is any whole number.

Therefore we require that $T_2 - T_1 = n/f_0$, to be independent of the interval-halving ambiguity. This implies that:

$$\tfrac{1}{2}f_{pulser} = n/f_0 \text{ or } f_{pulser} = f_0/2n$$

is the condition to be immune to the $P1_n - P2_n$ vs $P2_n - P1_{n+1}$ interval ambiguity.

Figure 4:
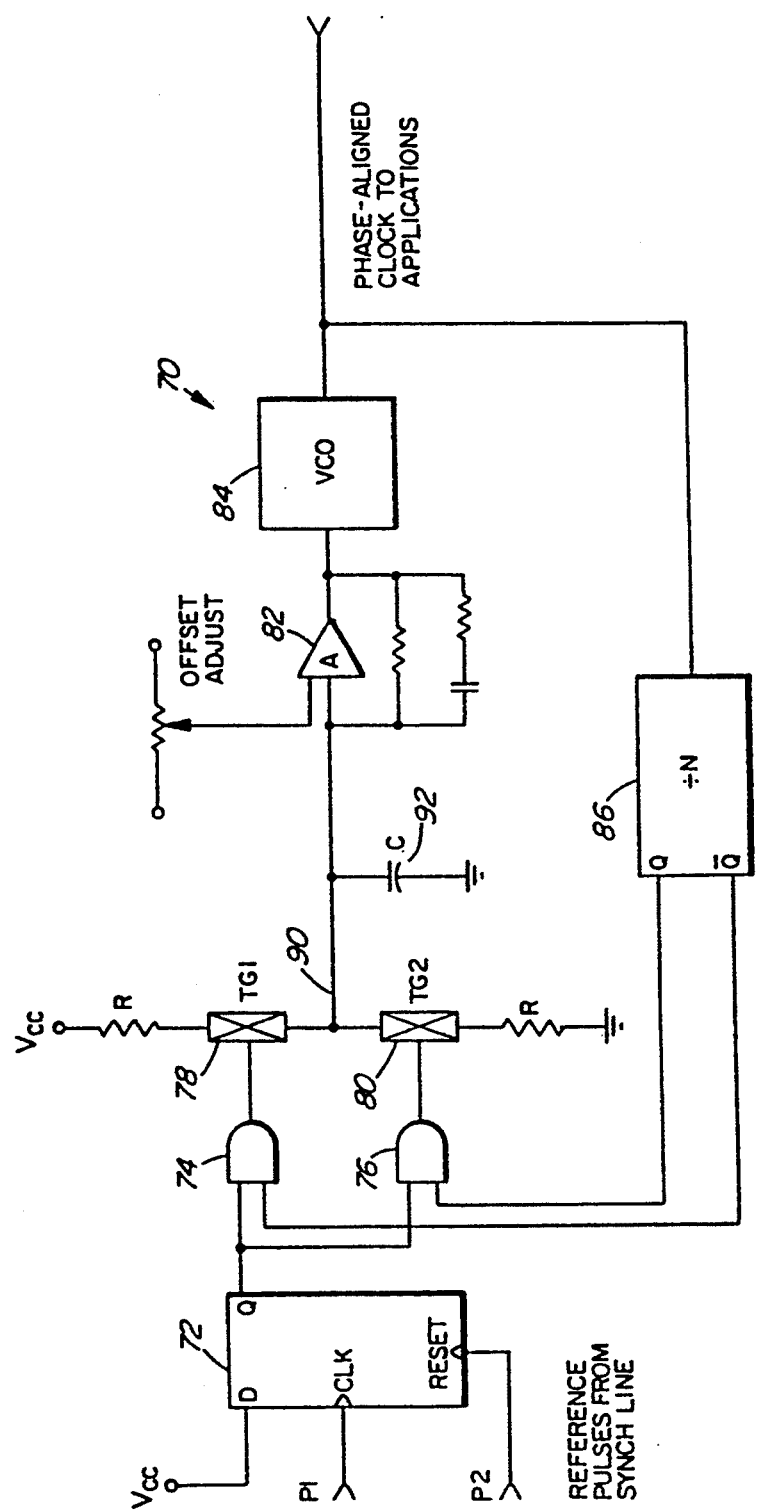
FIG. 4 illustrates the basic structure of a special form of phase lock loop circuit which performs an interval-halving function for clock distribution without requiring ramp generators or sample and hold circuits.
Figure 8B:
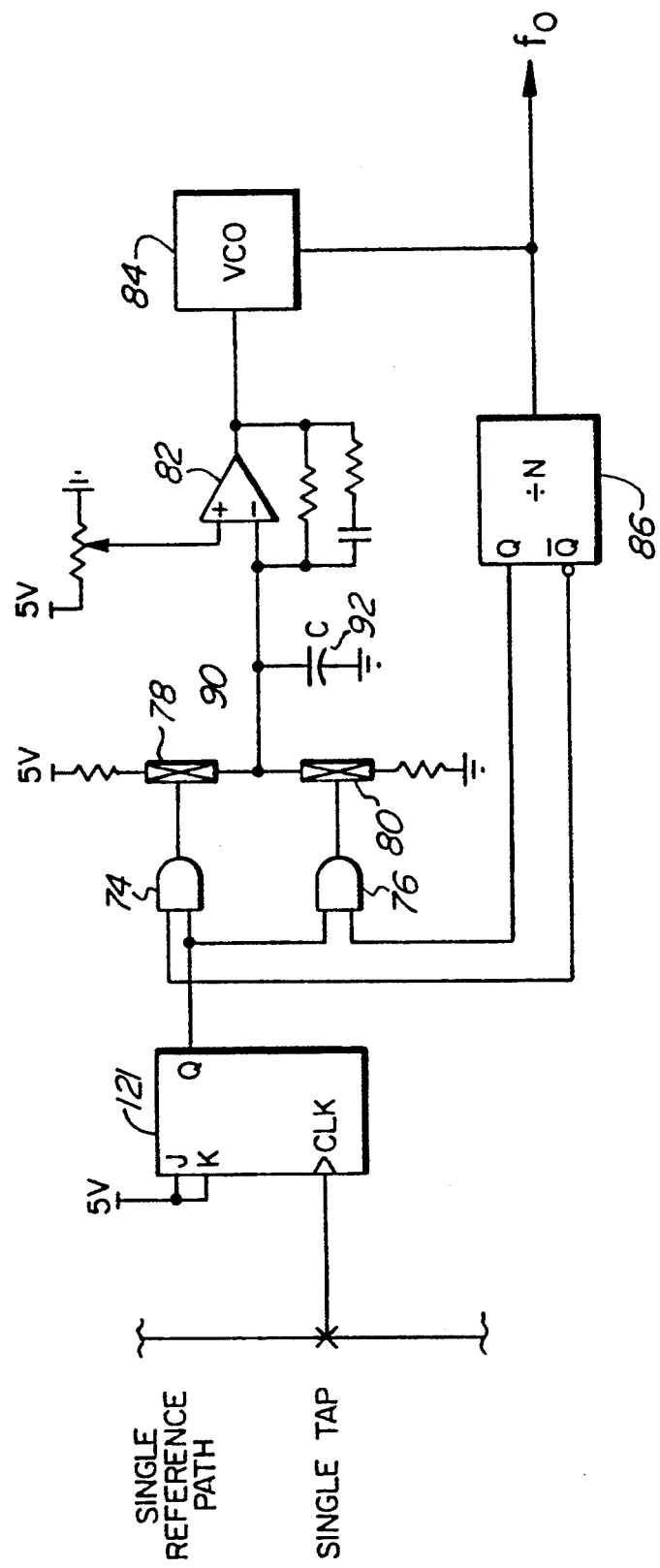

With this aspect of this invention having been explained, FIG. 8b shows how the PLL circuit of FIG. 4 is adapted to function in a single-reference-conductor mode, assuming the above condition is met for the relationship of the derived application clock to the reference pulse injector frequency, $f_{pulser}$ FIG. 8c components 74, 76, 80, 78, 90, 92, 82, 84 and 86 are identical to those in FIG. 4. The new element is JK flip-flop 121. JK flip-flop 121 has the property of toggling its Q output every time a P1 or P2 pulse passes on the reference line because its J and K inputs are both held at logic one. This flip flop will therefore arbitrarily adopt one or the other of the two possible senses of dividing P1–P2 pulses. The Q output of 121 is thereby a pulse spanning either $P1_n - P2_n$ or $P2_n - P1_{n+1}$ but in either case providing the gating pulse shown in FIG. 5a(vii) and FIG. 5b(vii) for operation of the remainder of the circuit as previously described and shown with the aid of FIG. 4. Therefore, this form of PLL locks to one or the other interval, halving it as usual, and is unaffected by which interval is randomly chosen as long as $f_{pulser} = f_0/2n$ is satisfied. Since $f_0$ is indirectly locked to $f_{pulser}$ the exact equality required for this condition does apply. In fact, a convenient system design is to make N in the ÷N circuit 86 equal to any even number suitably large so that $f_{pulser}$ remains greater than 2D/v as discussed earlier. One subtle effect of locking to the $P2_n - P1_{n+1}$ interval rather than $P1_n - P2_n$ interval is an effective difference in loop gain. The same variation in effective PLL loop gain results from width variation in the basic charge-discharge balance mechanism as position on the line is increased away from the injector site. Within this invention, however, it is possible to use an AGC amplifier for the loop amplifier 82 in FIG. 4, and control the amplifier gain in inverse proportion to a circuit which detects the total width of the Q output pulse from flip-flop 72 in FIG. 4. In this way the effective loop gain at all sites is equalized by increasing the lumped amplifier gain as one approaches the end point at distance D.

A population of modules requiring to be clocked phase synchronously can also be synchronized by Free-space synchronization reference medium if they have the appropriate detectors and are within the field of an injection pulse emitter and a return pulse emitter (or reflector) using radio or lightwave or infra-red or any other high frequency electromagnetic radiation that is conveniently and safely generated and detected. The circuit. This type of phase detector only produces changes to the phase lock loop loop error signal when valid phase reference pulses are provided at its reference input.

As mentioned earlier, a range of enhanced processing alternatives is possible to provide greater precision if desired in determining the time of down-passing and pulse return-passing, so as to be independent of transmission effects on the reference pulse waveshape. For example, if the pulse injector actually transmits a coded pseudo-random pulse-sequence (such as in radar-ranging for instance) then the optional interface circuit block 58 in FIG. 3 may contain digital sequence correlators that approximate a matched-filter symbol-time detector for the given reference sequence. As another example, this subcircuit might perform waveform differentiation or other forms of frequency dispersion correction, pulse shaping and/or pulse regeneration so as to use the instant of maximum point of signal change as the reference time in conjunction with a pulse injection circuit that transmits a gated sine-wave burst or dual-polarity di-pulse signal as the reference-providing pulse element. Thus, it is within the scope of the present invention to provide interface subcircuits which contain an arbitrary level of sophistication of known signal processing methods for determining the exact time of passing of the reference signal. The choice of such techniques is within the domain of engineering specific applications of this principal method to suit a given distance-skew and module-population requirement. However, a significant range of practical applications are not anticipated to need advanced time-detection processing, particularly in light of the findings in the subsequent analysis sections.

The absolute phase stability of the pulse injector ultimately sets the absolute phase stability of the system if measured against an external reference. The injector will typically be a stable reference oscillator 60 (FIG. 1), (the same master oscillator that would be present in the conventional hierarchical system), followed by a DIVIDE-BY-N circuit 62 to generate a reference injector frequency that is an integer factor of the rate at which the remote modules are to achieve phase lock. Slow drift in the master oscillator phase is of little concern since the entire system tracks the master and skew is defined as differential timing error amongst the system elements. Therefore, this system concept does not require stability from the master oscillator that is in excess of typical stability requirements in hierarchical clock distribution schemes.

Because the method of the present invention relies on phase lock achieved through phase comparisons made only every N clock cycles at the desired frequency, there is an inherent frequency lock ambiguity which can be avoided through control of the free-running oscillator frequency.

Frequency ambiguity means that false lock could occur at any frequency, $f_m$, satisfying the relation:

$$N/f_0 = (N+m)/f_m \quad m := \ldots -2, -1, 1, 2, \ldots \quad (1)$$

where $f_0$ = desired oscillator frequency and N is the number of clock cycles between interval-halving phase references. Thus, to rule out frequency lock errors, module oscillators require free-running frequency stabilities, defined as $f_{actual}/f_0$ better than:

$$\frac{N-1}{N} < \frac{f_{actual}}{f_0} < \frac{N+1}{N} \quad (2)$$

This is not a very stringent requirement since N=100 only requires 0.1% oscillator frequency stability. In most applications, subsequent consideration of how target skew, system distance, and oscillator stability interact will set a tighter oscillator requirement than that given by avoidance of the false-frequency lock ambiguity.

It is conceptually possible to have more than one reference-providing pulse propagating in the synchronization path at one time. However, the majority of useful applications do not require this level of complexity. Therefore, the limit to reference signal injection frequency is given by:

$$f_{pulser\ max} = v/2D \quad (3)$$

where D = distance to looparound point
  v = kc = propagation velocity; k < 1
  c = light propagation velocity in vacuum Relation (3) sets the maximum pulse injection frequency that is possible without ambiguity (of the first type) for the interval-halving circuits; however, in system design, the above value will be reduced somewhat so that appropriate recovery time provided for the interval-halving circuit implementation between s2 and s1 pulse arrivals. In addition, the injector frequency must be an integer factor of the target clock frequency in the synchronized modules. This is so that locally-derived phase references are not only coincident in time across the system but are also perfectly periodic as a time series at each site with respect to preceding phase references, at the clock rate of the system. When this is taken into account, the maximum reference signal injector frequency is reduced slightly to:

$$f_{pulser\ max} = f_{hs}/[floor\{f_{hs}2D/v\}] \quad (4)$$

where $f_{hs}$ is the frequency of the high-speed system clock and floor{arg} is a function that takes the largest integer less than arg.

The following description considers the interaction between the geographical extent of a system, which broadly determines the maximum frequency of reference pulse injection (equation (3), above), and the stability requirement of the oscillators being phase-locked to the common timing reference derived from the reference path. Intuitively, if the reference pulses occur less frequently, then better phase lock loop oscillator stability is required so that the phase skew does not build up during the free-running interval between phase reference times when any accumulated phase error is cancelled.

The time interval between derived phase references is always somewhat larger than [2D/v] (but close to it), from above. If, during that time, the phase error builds up at a rate alpha (rad/sec), then the maximum skew, in seconds, of any given oscillator with respect to an unmoving phase reference would be $$t_s = alpha(2D/v)/(2\pi f_{hs}) \ (seconds) \quad (5)$$

where $f_{hs}$ is the nominal clock frequency. The maximum skew from module to module could be up to $2t_s$.

To determine the oscillator stability requirement for a given skew objective, alpha can be reinterpreted in terms of the frequency stability of the oscillator as follows:

$$\text{alpha} = 2\pi f s_0 \tag{6}$$

This expresses alpha, in terms of the oscillator stability (dimensionless ratio) $s_Q$. This is preferred to alpha because $s_Q$ is the actual form for oscillator specification. If the above is used for $s_Q$ and alpha is substituted in the expression for $t_s$, then:

$$t_s = s_0 2D/v \tag{7}$$

for the maximum skew in units of time at one oscillator. As a numerical example, if it is assumed that the system has a requirement of 1 nsec peak skew between local module clocks operating at 100 MHz and the propagation velocity of the synchronization path is 0.8 c, then from (7)

$$1 \text{ nsec} = 2 \ t_s = (4D/v) s_0$$

and the following results for systems of the scale of immediate interest are obtained:

| D (meters) | $S_o$ (required for 1 nsec peak skew) |
| --- | --- |
| 10 | $6 \times 10^{-3}$ |
| 100 | $6 \times 10^{-4}$ |
| 1000 | $6 \times 10^{-5}$ |

In the 100 meter example system, the pulse injection rate is 1.25 MHz and the module phase lock loop oscillators free run for 8 clock cycles between phase references at 10 MHz and run for 80 clock cycles between references at 100 MHz. It is to be noted that oscillator stabilities of the order shown are commercially available and do not pose a difficulty. It is also to be noted that the expression for skew (in units of time) as a function of D and $s_0$ is independent of the clock rate. This occurs because, as the phase lock loop frequency rises, more pulses occur between "checkpoints" but for the same fractional stability, the buildup of time error between the reference times is the same with fewer, wider clock cycles of equal fractional stability.

If coaxial cable is used, the dispersion of the pulses is minimized, if one used a precision high-impedance, impedance-controlled tapping technology such as that developed for the Ethernet LAN. This type of coaxial cable and tapping assembly can support large numbers of passive taps with minimal impedance disruption. If fiber optics is used for the synchronization reference path, reference signal degradation can be quite small due to the wide bandwidth and low loss of the fiber and the optical splitter components that are available. In any case, even if the reference signal does suffer some distortion, the scheme is inherently immune to a certain most important class of transmission effects on the reference pulse. In addition, pulse coding and pulse regeneration methods and interval-halving circuit offset adjustment can further reduce such effects to whatever level is necessary in a particular application.

However, when the travelling pulse undergoes loss or distortion, the derived clock phase skew is affected by altering the uniformity of down and back time intervals through differences in the switching point on the reference pulse with location in the system.

To analyze the effects of travelling pulse evolution, the error in input switching time with respect to the distortionless pulse is denoted as e(x), where x is the position on the line. In the outgoing direction, a site at position (x) from the pulse injector sees an errored s1 switching time that is $[x/v + e(x)]$.

In the returning direction, the same module at location (x) will see an s2 switching time that is $[(2D-x)/v + e(2D-x)]$. The resultant time reference is derived from the midpoint of these two and this gives:

$$\begin{aligned} t_0(x) &= [2D/v + e(x) + e(2D - x)]/2 \\ &= D/V + [e(x) + e(2D - x)]/2 \end{aligned} \tag{8}$$

The absolute time of the system-wide reference that is derived is not of concern but, rather, its variation from site to site, e'(x). The derivative of the above expression with respect to x is therefore of primary interest.

If $e(2D-x)$ is expanded as a Taylor series about the point 2D, an expression only in terms of the function value at 2D (a constant) and the general function e(x) is obtained. With $u = 2D - x$, e(u) is expanded about 2D as follows:

$$\begin{aligned} t_0(u) &= \frac{D}{v} + \frac{1}{2}\left[ e(x) + e(2D) + \frac{e'(2D)(x - 2D)}{1!} + \frac{e''(2D)(x - 2D)^2}{2!} + \frac{e'''(2D)(x - 2D)^3}{3!} \cdots \right] \\ &= \tfrac{1}{2}[2D/v + e(x) + e(2D) - e'(2D)x + e''(2D)x^2/2! - e'''(2D)x^3/3! + \ldots] \end{aligned} \tag{9}$$

and since $u' = x'$, taking the derivative of $t_0(u)$ with respect to x provides an expression for the derivative of the lock-point time with respect to position in the path, for any general switching time error function e(x) due to pulse evolution:

$$t_0'(x) = e'(x) - e'(2D) + xe''(2D) - x^2 e'''(2D)/2 \ldots$$
$$+ \text{higher order terms} \tag{10}$$

This represents the dependency of the derived reference time on position in the presence of a time detection error function e(x). By inspection, there is no dependency on x for any linear c(x) characteristic because in such a case $e'(x) = e'(2D)$ and $e''(2D) = 0$. This means that the system is unaffected by the linear component of switching time error buildup on the travelling pulse. This is a desirable property since the largest term of actual e(x) relations is usually a linear term in the dependency of switching point on the reference pulse versus transmission distance. The next largest term in practice is often a random device-to-device switching threshold variation at each tapping point and this does not accumulate to introduce any systematic skew although it can contribute a random skew component.

ALTERNATIVE EMBODIMENTS

Several variations on this basic method are fairly obvious from the foregoing and may provide improved economics and/or performance in certain applications but do not change the underlying principle of operation. For purposes of describing the invention above, the following basic configuration was considered:

separate conductors down and back
simple non-regenerative looping
simple rectangular pulse as the travelling reference signal
non-regenerative tapping at the synchronizing module points
synchronized modules are point nodes By comparison to this basic descriptive configuration, the following variations are possible:

Single Synchronization Reference Medium: The essential two-pass reference propagation aspect of the present invention could also be provided with a single reference path conductor through reflection either by a short-circuit (opposite polarity reflection) or open-circuit (same polarity reflection) termination in an electrical system; or it may be a silvered (or just cleaved) fiber-end in an optical system. For thoroughness, it is also necessary to mention that a regenerative electrical or optical termination of a single conductor based system is also possible in principle through the use of an electrical hybrid circuit or an optical coupler and combiner assembly.

Free-Space Synchronization Reference Medium: With certain simple considerations or constraints, the scheme described can be implemented using free-space propagation paths such as infra-red and radio waves, as dealt with later.

Regenerative Looping: Whether electrical or optical, it is possible to provide an active regenerative looping circuit 64 (FIG. 1) of arbitrary precision. The advantage of this would be found in a system where round-trip pulse degradation would be enough to introduce a significantly nonlinear e(x) term, in which case regeneration at the looping point may be advantageous by returning to the linear c(x) region in the return direction. The regenerative looping circuit would be similar to the traveling pulse injector in FIG. 1 but triggered rather than free-running. It is to be noted that the additional delay of such an active loop circuit is not of concern because it uniformly shifts the system-wide absolute time reference and this is of no practical concern.

Enhanced Reference Signal Processing: As discussed above, injecting a simple rectangular pulse serves well in a number of useful applications. Nonetheless, there may be advantage in some large and/or particularly high frequency applications in the use of a more sophisticated reference signal and associated detection circuits. Examples are the use of pulse-code digital correlation sequences, preferred analog pulse shapes, bipolar digital pulse shapes and so on.

Regenerative Tapping: Another variation that may improve performance under certain conditions and with certain technologies is to terminate and regenerate the propagating reference pulse at each module that is extracting synchronization. If appropriately implemented this can completely eliminate residual skew due to reference pulse shape and level evolution in the synchronization path. The net performance benefit is a tradeoff between the undesirable reduction in the frequency of interval-halving reference pulses for the phase lock loop due to regeneration delay, (and possibly increased random skew due to variations in regeneration delay), and the benefit due to preservation of travelling reference pulse shape by regeneration.

Hierarchial Fanout from Nominal Synchronization Points: All discussion so far has treated the synchronized modules as essentially point nodes where the state devices to be clocked are located. Obviously, however, the modules that are synchronized directly as nodes on the synchronization trunk could themselves act as the roots of conventional local clock distribution trees emanating from their location using conventional hierarchical distribution methods. This permits an even greater number of total devices to be synchronized from the reference trunk for a given number of trunk taps and phase lock loop oscillators.

The following description relates to some improved circuit implementations and some further varying methods for exploiting the present invention.

Having shown in FIG. 3 the interval-halving function which is followed by a conventional phase lock loop, it is possible to now introduce a particular phase lock loop design that will achieve the same result as the interval-halving plus phase lock loop combination, but which is not obvious without having fast considered the former combination.

FIG. 4 illustrates the basic structure of a special form of phase lock loop circuit 70 that can be used to perform a function that is equivalent to interval-halving followed by a conventional phase lock loop. The advantage of this circuit is that the linearity requirements of the ramp generators are avoided and the circuit has significantly fewer components in total.

Figure 5A:
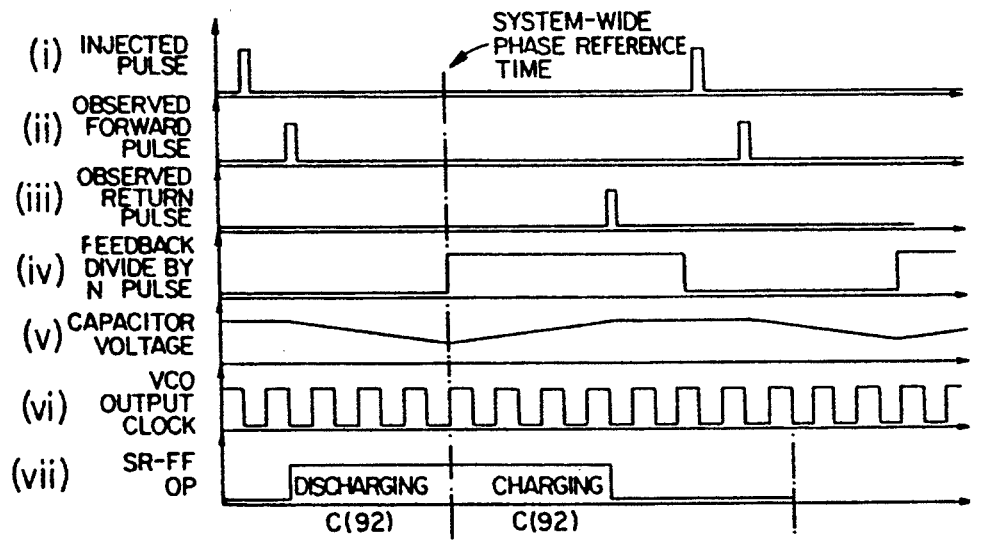
FIGS. 5a(i)–(vii) and 5b(i)–(vii) illustrate two sets of waveform diagrams of signals in the circuit of FIG. 4 at two spaced positions of a reference path.
Figure 5B:
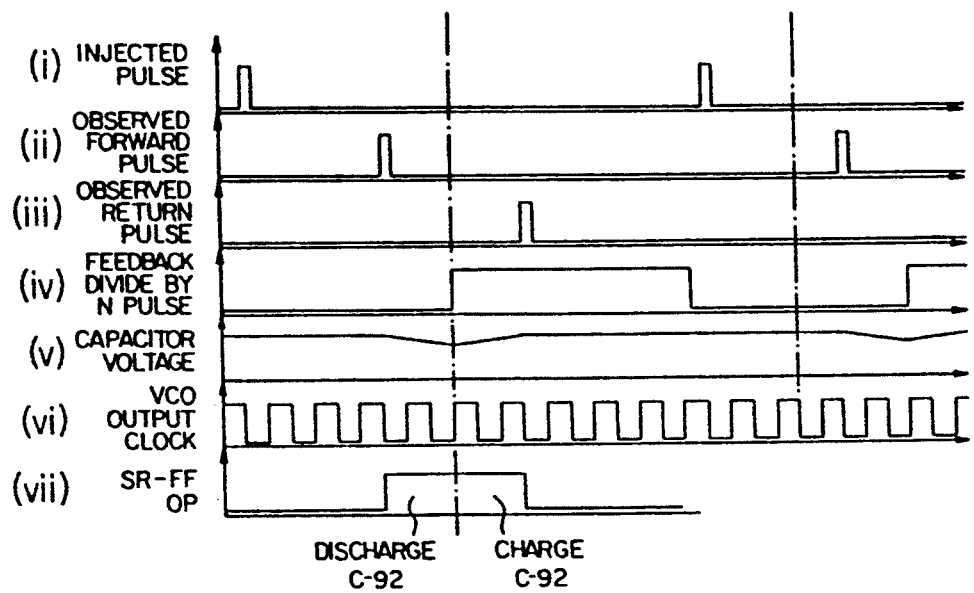

In FIG. 4, components 72, 74, 76, 78, 80 comprise a special form of phase detector whereas a loop filter 82, voltage-controlled-oscillator (VCO) 84, divide-by-N feedback divider 86 are common parts of a phase lock loop. The phase detector includes a SET-RESET FLIP FLOP 72 which is connected on its SET input to the downstream reference cable and on its RESET input to the returning cable path. The injected pulse, observed forward pulse and observed return pulse are illustrated in FIG. 5a and 5b for two sample positions. As the reference pulse travels down and then back, the Q output of SET-RESET FLIP FLOP 72 produces a pulse, the midpoint of which represents the desired system-wide clock alignment reference time. In order to lock the rising edge of the VCO output (FIGS. 5a(vi) and 5b(vi)) clock to this reference time (when in lock), the VCO output, which is the high speed clock for the application, is divided by a factor N by divide-by-N feedback divider 86 (FIGS. 5a(iv) and 5b(iv)) and the positive and inverted divider outputs are combined in AND gates 74, 76 with the output from the SET-RESET FLIP FLOP 72. The outputs of the AND gates control the ON-OFF state of two FET transmission gates 78 and 80 which behave as high speed electronically controlled current switches. The effect of this arrangement is as follows: During any time that SET-RESET FLIP FLOP 72 is not SET (Q=0), both transmission gates are OFF putting the voltage control node 90 in a high impedance state, with voltage held at a constant value by a capacitor 92 whose output waveform is shown in (FIGS. 5a(v) and 5b(v)). Neglecting leakages over short time intervals, this means that between reference pulses, the VCO operates at the frequency and phase set by the control voltage at node 90.

During the interval between a reference pulse at P1 and the returning P2, transmission gate 78 will be ON when the divider 86 output is false and OFF when the divider output is true, and vice-versa for transmission gate 80. Therefore, if the output transition from divider 86 does not lie in the middle of the output pulse from SR-FF 72, one transmission gate or the other will conduct over a greater duration than the other, causing a net change in the voltage on capacitor 92, which changes the VCO phase/frequency slightly. In this way, successive reference pulse events both drive the loop into initial frequency and phase lock and then maintain negative feedback controlling of the output of the DIVIDE-BY-N circuit transition so as to lie in the middle of the reference interval, thereby locking the rising edge of the VCO clock in every module to a common time just preceding (3-4 nsec) the rising edge output from Divider 86. Amplifier 94 provides an adjustment of loop gain and a means for offset nulling and lead-lag loop filtering.

Waveform diagrams from within a prototype system are shown in FIGS. 5a and 5b. FIGS. 5a and 5b shows how these two sites implicitly derive a common clock phase. The actual waveforms were obtained from two sites physically about 65 feet apart on a coaxial cable, driving the application within $\pm 1$ nsec at 20 Mhz with $f_{pulser} = 2$ MHz.

Figure 6A:
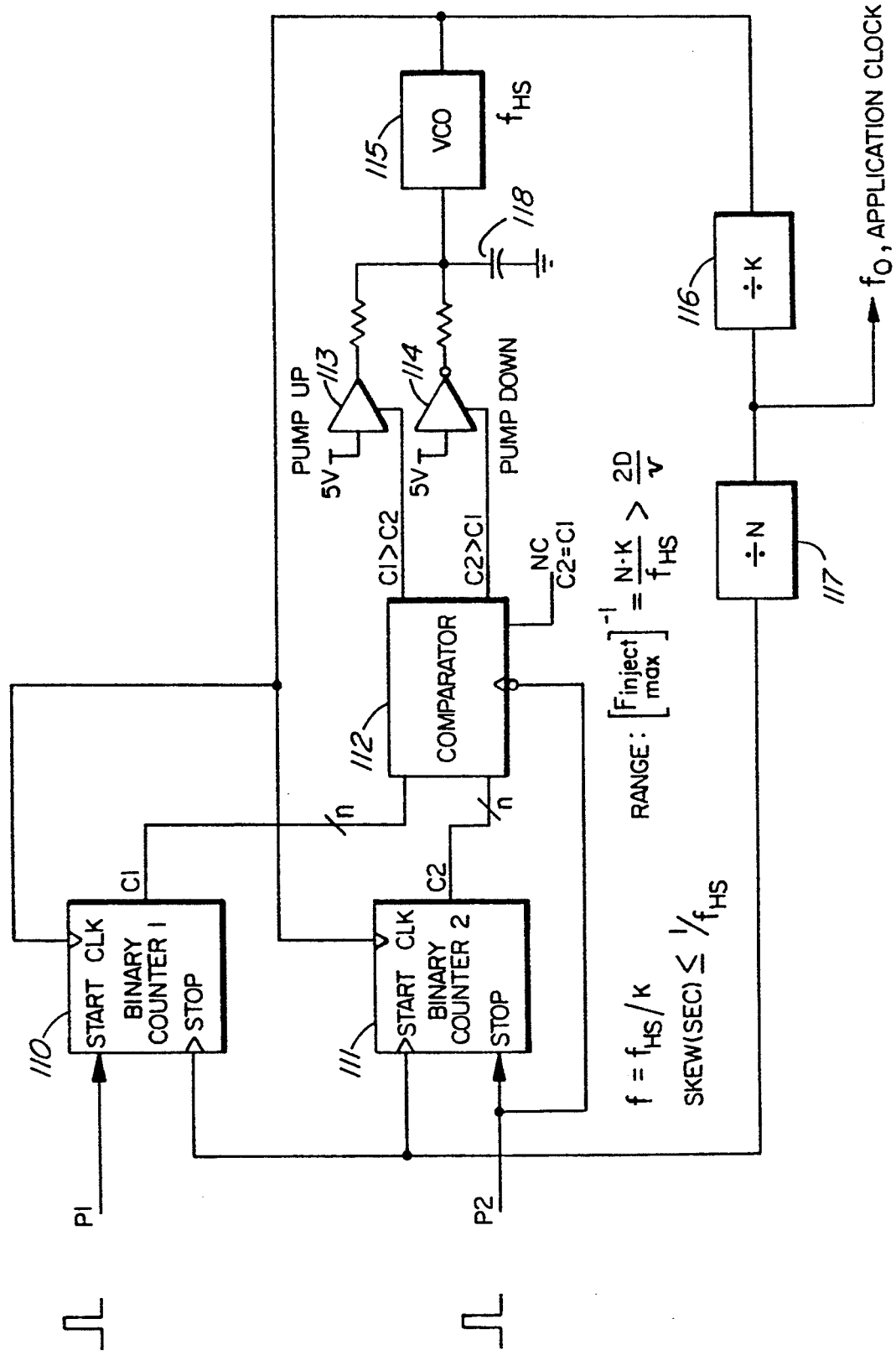
FIGS. 6a and 6b are circuit diagrams for a nearly all digital interval halving and phase lock loop and a truly all-digital circuit.

A nearly all-digital circuit implementation of the direct interval-halving PLL is shown in FIG. 6a. Such an implementation is preferred in some cases so that the circuit is more easily produced in a completely integrated circuit fashion. Its properties differ slightly from those of FIG. 4, the key differences being that the VCO runs at a rate higher ($f_{HS}$) than the application clock ($f_0$) which is to be phase controlled, and the maximum skew characteristic is strictly contained within the region of $\pm \frac{1}{2} f_{HS}$. By comparison, the circuit of FIG. 4 can produce skews that are strictly not limited, the skew being dependant ultimately on the precision of the analog components and their adjustment.

In FIG. 6, $f_0$ and $f_{HS}$ are related by divider 116 such that $f_0$ is $f_{HS}/k$. Pulses P1 and P2 represent respectively the down and back reference pulse detections shown for convenience in terms of physically separate conductors for down and back propagation paths. (This will be shown later not to be an essential requirement.) Outgoing pulse P1 resets and starts binary up-counter 110 which counts the high speed VCO clocks until the output of divider 117 rises, stopping counter 110 and holding its count. The same rising edge from 117 resets and starts an identical counter 111, which is finally stopped by returning reference pulse P2.

In order to see if the current phase of the application clock $f_0$ is aligned to the system wide reference time instants, the count values reached by 110 and 111 are compared by digital comparator 112, on the down edge of the returning P2 pulse.

If the counts $C_1$ and $C_2$ are equal, it implies that the rising edge of $\div N$ counter 117 is at the midpoint of the P1-P2 time interval within $\pm \frac{1}{2} f_{HS}$ seconds. (Divider 117 is analogous to divider 86 in FIG. 4). In such a case, the loop will make no adjustment to VCO 115. It can be seen however that if the rising edge of counter 117 output lags the midpoint, count $C_1$ will be greater than $C_2$. When $C_1 > C_2$, tri-state buffer 113 is enabled to pump capacitor voltage 118 up, thereby slightly raising the frequency of VCO 115 so as to advance the time at which the output $\div N$ of 117 switches. Similarly, if $\div N$ output 117 leads the midpoint of the P1-P2 interval, $C_2 > C_1$ will be decoded by comparator 112 causing tri-state buffer 114 to be enabled to sink (leak) current out of capacitor 118, thereby slightly reducing the frequency of VCO 115, and thereby demonstrating negative feedback control over VCO 115 such that the phase of $f_0$ is controlled to within $\pm \frac{1}{2} f_{HS}$ seconds of the system-wide interval-halving reference time instants.

Figure 6B:
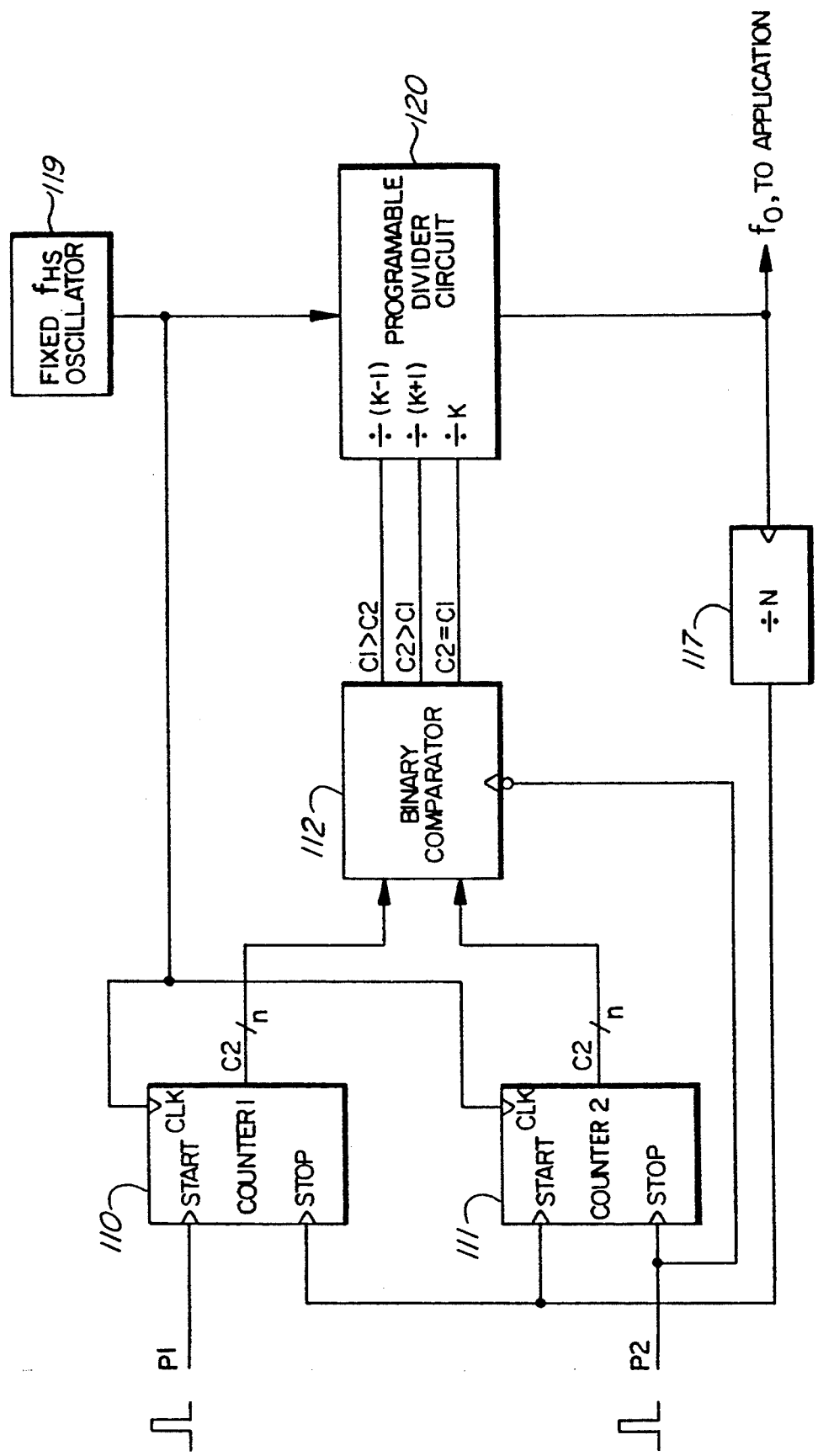

FIG. 6b shows a further form of interval-halving PLL for distributed synchronization that uses only digital logic components throughout. Counters 110, 111, comparator 112 and divider 117 are exactly as in FIG. 6a and are accordingly given the same numbers. However, the tri-state pump up/down arrangement with buffers 113, 114 and capacitor 118, plus the VCO 115 of FIG. 6a are replaced in FIG. 6b through the use of programmable divider circuit 120 in conjunction with fixed-frequency oscillator 119. This circuit controls the phase of the output of $\div N$ circuit 117, and hence the phase of $f_0$, the application clock, by dynamic control of the instantaneous divide ratio produced by divider 120.

This arrangement permits a fixed-frequency fits clock 119 rather than needing a voltage-controlled oscillator. Through dynamic feedback control of the divider 120, both phase and frequency instability of the master oscillator 119 are tolerated (within limits). This circuit strictly controls the phase of the application clock, $f_0$, to within $\pm \frac{1}{2} f_{HS}$ seconds but it may now be the characteristic of $f_0$ that its phase is continually moving from one limit through the range $\pm \frac{1}{2} f_{HS}$ and then is abruptly reset to the other edge of the allowed phase skew range. However, as long as this jitter is bounded within the application requirements for skew on $f_0$, this is not of concern.

Figure 7:
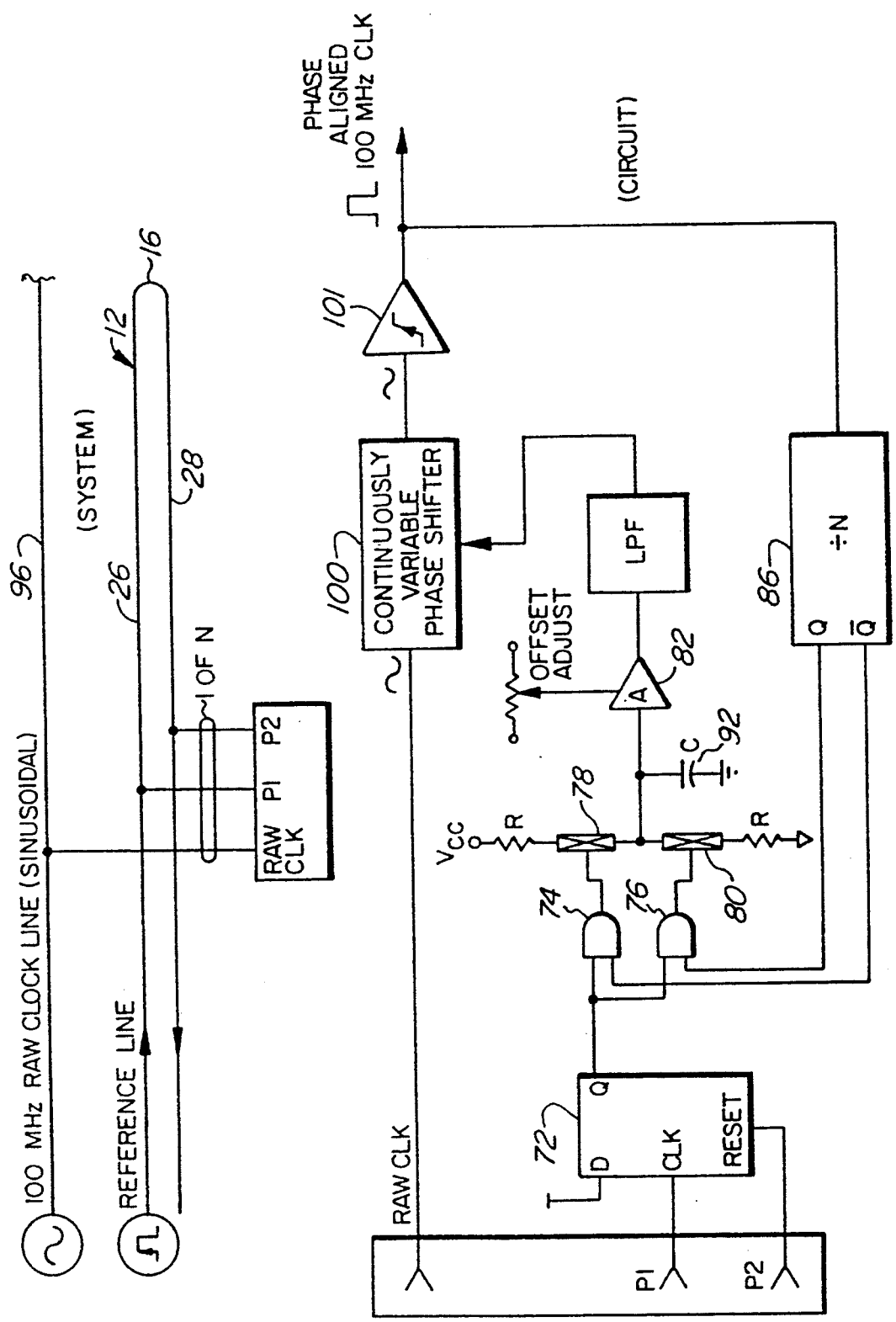
FIG. 7 illustrates a variable phase-shift circuit which, under control of a phase-detector, adjusts the phase of a locally received raw clock to align with a system-wide phase reference.

In some applications, it may be more economic or higher range-frequency-skew performance may be obtainable through a variation which uses the same Method for derivation of time-reference instants but uses a third conductor 96 (FIG. 7) to additionally distribute a raw clock signal to every synchronous station. With FDM or WDM techniques, the so-called raw clock can be transmitted over the original two conductors especially since only a single continuous-wave tone need be provided for the raw clock. For clarity, however, this method is described in terms of three physically distinct transmission paths. With reference to FIG. 7, this method consists essentially of replacing the previous VCO 84 with a variable phase-shift circuit 100 and comparator 101 which will, under control of the same type of phase-detector described earlier, adjust the phase of the locally received raw sinusoidal clock to align the square wave clock out of comparator 101 with the system-wide phase reference derived from the two pass propagation principle. As can be seen, the remaining components are similar to those illustrated in FIG. 4 and, accordingly, like reference numerals have been used to designate like components. The phase shifter may be either of the digitally controlled programmable type or a continuously variable type. In all applications, however, the phase shifter is relatively simple because only a single frequency need be considered (broadband phase-shifters are more difficult) and linearity requirements are quite loose because any such variations are compensated by the closed loop. In addition, delay in the sine-to-square wave converting comparator 101 is compensated by the measurement of phase for phase comparison after the comparator.

However, by using variable phase shifters, an important new system design variable must be considered. This is the number of quadrants over which the phase shifter functions. For example, the amount of phase variation obtainable by simply tuning a single order resonant circuit, using the phase slope on the skirts of the tank response to obtain phase shift is from 0 degrees return pulse emitter is triggered by the arrival of the P1 emission. In such a scheme, the use of a returning wavelength different from the "outgoing" wavelength is analogous to the 2-conductor scheme. In conjunction with single-reference path methods (above and following) the same emitted wavelength can be returned by a reflector.

Figure 9A:
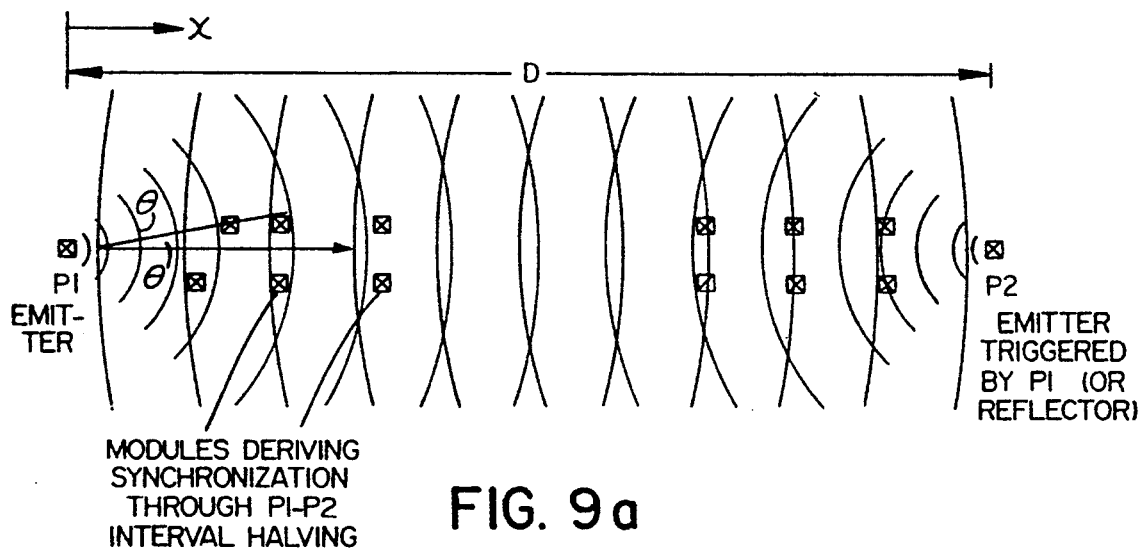
FIG. 9 illustrates an embodiment of the invention operating through the use of free-space infra-red or radio propagation paths to provide a two-pass propagation embodiment.

Inspection shows that the spatial arrangement of the modules to be synchronized within the field of the P1 and P2 emitters (or reflector) in FIG. 9 is immaterial as long as they are grouped such that a plane-wave approximation holds with respect to the outgoing and returning wavefronts in FIG. 9. To the extent that the plane wave approximation is achieved, or position-dependent delay due to wavefront angle is compensated by one-time alignment adjustments in the interval-halving circuits, the signal processing at each module to derive a series of system-wide time reference instants is identical to that which has been described in FIGS. 1 to 3 and will be described for FIG. 4.

If the plane wave-approximation is applicable (i.e. sin $\theta$ is small if a point source is assumed, or if a wavefront source array is used), then each site sees a P1 pulse at time (x/c) and a P2 pulse at time (D-x)/c, where x is the x-coordinate of the site as shown in FIG. 9. Given these conditions, the previously described circuits process P1 and P2 pulse detections identically to the linear-guided medium case treated already and there is no difference due to the fact that free space reference pulse propagation was employed.

The P1 and P2 pulses arc detected either by photodiodes or antennas rather than cable taps. The P2 return emission function can either be a reflection, in which case P1 and P2 are on the same wavelength and the signal processing than used is equivalent to the "single conductor" case of FIG. 8.

Figure 9B:
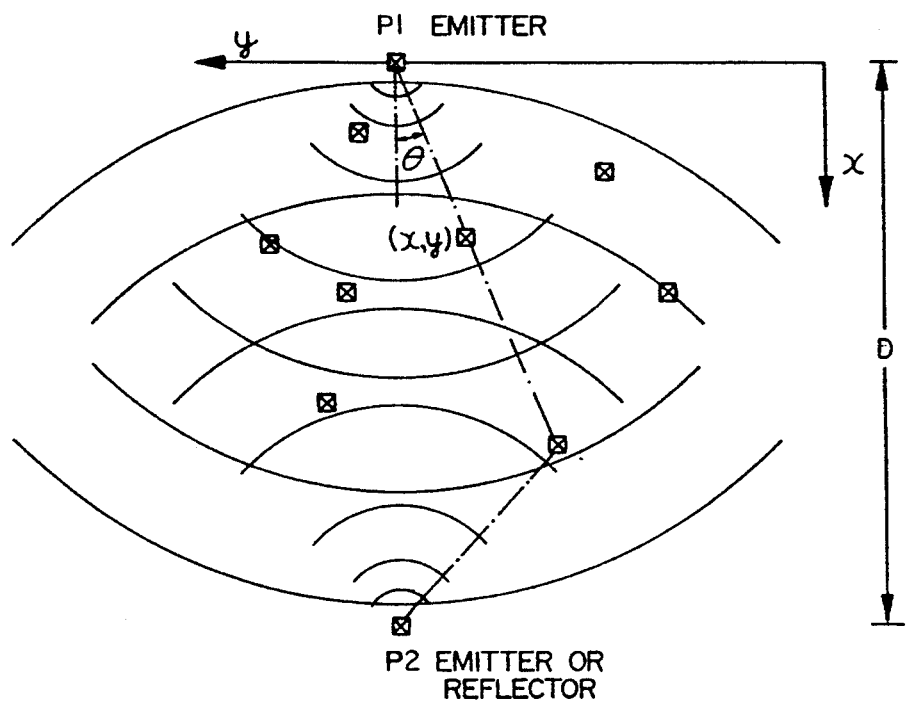

In a more general spatial arrangement of modules to be synchronized via this invention using free space propagation, both the x and y co-ordinates of the modules positions are important as shown in FIG. 9b. In this arrangement a module at (x,y) will detect a P1 pulse at time $$t_1 = \frac{[x^2 + y^2]^{\frac{1}{2}}}{c}$$

and a P2 pulse at time $$t_2 = (D/c) + \frac{[(D - x)^2 + y^2]^{\frac{1}{2}}}{c}$$

and the circuits described will interval halve and lock to a mid-point reference time characterized by $$T_1 = \frac{t_1 + t_2}{2} = [(x^2 + y^2)^{\frac{1}{2}} + ((D - x)^2 + y^2)^{\frac{1}{2}} + D]/2c$$

whereas the strictly cable-borne system with length D would result in a system-wide reference time of D/c assuming, for comparisons sake only, that the cable-borne system had v+c.

Therefore the "y-component" induced lock-point skew is $$S_y = T_1 - D/c$$

$$= \frac{1}{2c} [(x^2 + y^2)^{\frac{1}{2}} + (D^2 - 2Dx + x^2 + y^2)^{\frac{1}{2}} + D] - D/c$$

which goes to zero as y goes to zero and which can be computed for any (x,y) spatial arrangement for a given distance D between P1 and P2 emitters. If the $S_y$ value is computed with the above for any proposed geometry, lock-point offsets can be introduced into the interval-halving PLL of FIG. 4 with the "offset adjust" potentiometer associated with amplifier 82. In practice, such a system can be adjusted to null-out the y-component skew error at installation time in the field as long as the basic interval-halving PLL circuit design employed provides an amount of adjustment suitable for the worst-case y-component skew.

The worst case y-component skew would arise at a site with x component close to $\phi$ or D, having a large y-offset. If we do not permit any x-components less than 0-1D or greater than 0.9D for practical reasons, then the worst case y-component skew for a free-space propagation embodiment of this invention can be written in terms where the (x,y) co-ordinate measurements are normalized to D as:

$$S_y (y/D) = \max$$

$$D/2c[((.1)^2 + (y/D)^2)^{\frac{1}{2}} + ((.9)^2 + (y/D)^2)^{\frac{1}{2}} + 1] - 1/c$$

A worst-case of interest is a system in which the y-extent of the spatial arrangement of modules to be synchronized is equal to the x-extent, i.e. modules distributed in a rectangular area 0.9D by 0.9D. In this case, y/D =0.9 and assuming x/D =0.1 to produce the maximum angle $\theta$:

$$S_y (y/D= 0.9, x/D = 0.1) = 0.59 \, D/c$$
$$\max$$

That is to say that if the "interval-halving" PLL circuits employed have a lockpoint offset adjustment range of 59% of the one-way propagation time from P1 emitter to P2 emitter, then all modules within a square region 0.9D by 0.9D can be adjusted to be arbitrarily close to perfect synchronization, using the interval-halving principle plus a position-dependent adjustment of the zero-loop-error lock-point in the PLL of FIG. 4. In all cases the effect of y-offset is to retard the absolute phase of the derived-phase reference instants and the loop adjustment artificially advances the lockpoint. In the circuit of FIG. 3 this adjustment can be thought of as triggering comparator 54 at some position dependent constant less than $\frac{1}{2}$ of the previous ramp peak to advance the phase reference to the following PLL. Note that in the special case of all modules having a significant but equal (in absolute value) (y/D) component, the modules do not need any lock-point offset adjustments because although their actual lock-point is not at $\frac{1}{2}$ (D/c), it is nonetheless a system-wide common reference value.

In addition, there are many cases of practical usefulness where the maximum lock-point skew error of 0.5 g(D/c) is still negligible at the applications clock rate of example, a Wafer-Scale VLSI circuit where D=6 inches can neglect y-component skew error if the system does not require clock skew to be less than 0.5 nsec. maximum variation over the wafer.

Figure 10:
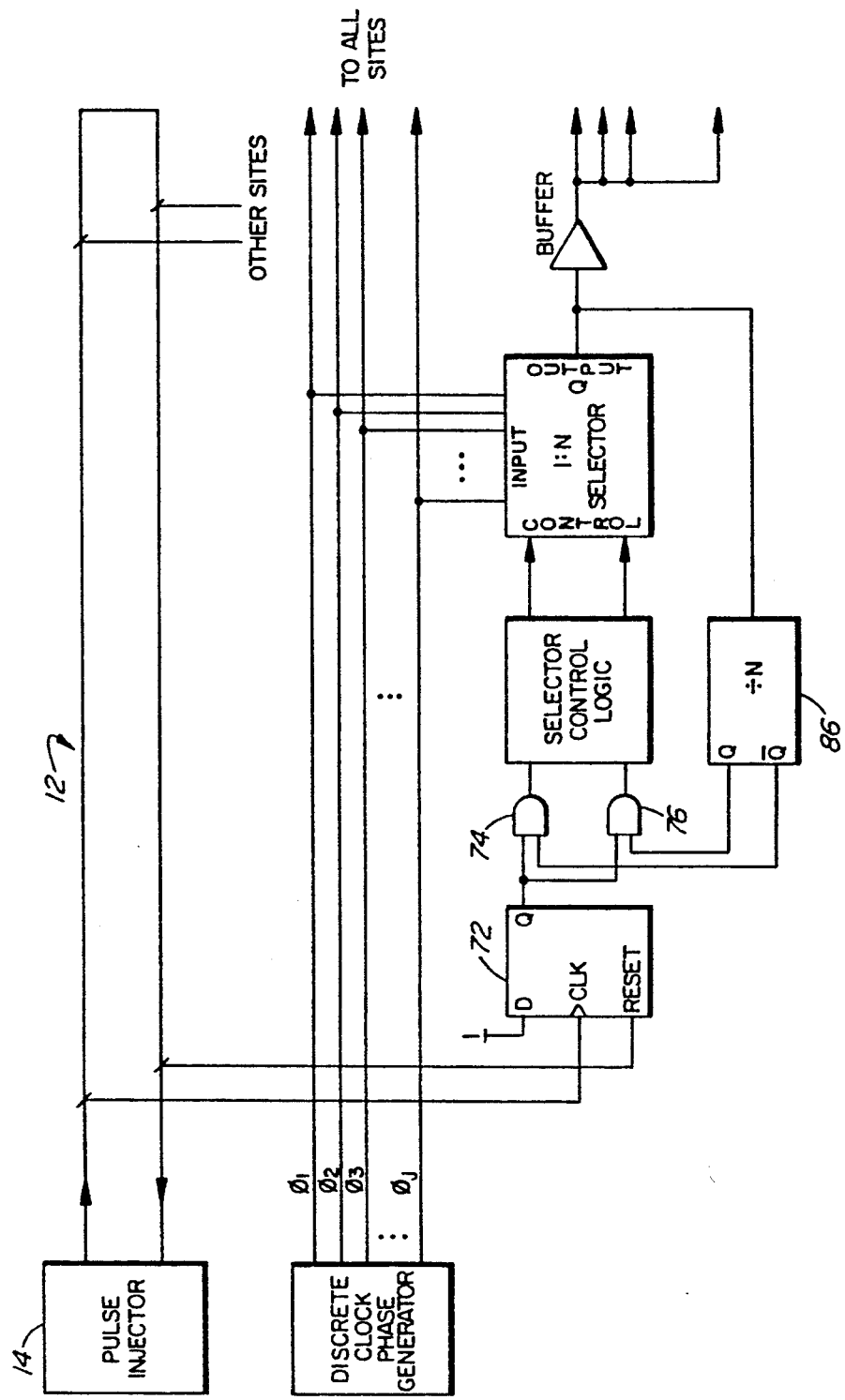
FIG. 10 illustrates an embodiment of the invention which is particularly advantageous for the distribution of a synchronous clock signal on VLSI integrated circuits.

FIG. 10 shows a variation of the present invention which is particularly suited to VLSI applications in which it may be undesirable, for implementation reasons, to require either a VCO or phase shifter as used in the previously described embodiments. In FIG. 10, an implementation of the invention is shown which requires only digital logic elements throughout. This embodiment functions in a conceptually similar manner to the embodiment which uses the phase shifter (FIG. 7), with the difference that J different discrete clock phases are distributed on J individual lines (new number) to all localities on the integrated circuit which require the synchronized clock. Rather then phase shift a single raw clock into the desired phase, this embodiment selects the individual clock signal which produces the minimum phase error out of the phase detector. For large VLSI applications, this advantageously trades the addition of J separate raw clock distribution lines, in order to permit a logical selector device to be used rather than a phase shifter or VCO, as in the other embodiments. The number J of individual clock phases is a design parameter chosen based on the system-wide residual clock skew that is acceptable, an increase in J reducing the skew.

The embodiments of the invention in which an exclusive property or privilege is claimed are defined as follows:

1. A clock distribution apparatus for use in providing a common absolute time reference to spatially distributed application modules requiring synchronized clocks, said apparatus comprising:
   means for transmitting an outgoing reference signal from a first site to a second site and a return reference signal from said second site to said first site upon arrival of said outgoing reference signal at said second site; and
   means at each said application module for detecting an outgoing reference signal and a corresponding return reference signal and producing a local phase reference signal approximately midway through the time interval required for said outgoing reference signal to travel from a signal detecting site at said application module to said second site and said return reference signal to travel from said second site to said signal detecting site.

2. An clock synchronizing apparatus as defined in claim 1, said outgoing and return reference signals having having a maxing frequency given by:

$$f_{pulser\ max} = v/2D \qquad (3)$$

where D=the distance from a detecting site to said second site;
v=kc=propagation velocity; k<1
c=light propagation velocity in vacuum.

3. An clock synchronizing apparatus as defined in claim 2, further including, at each said application module, means responsive to said local phase reference signal for adjusting the phase of a local clock associated with said application module whereby to provide system-wide phase coherent synchronization of said application modules.

4. A clock synchronizing apparatus as defined in claim 3, further including means defining a reference signal reference path for said outgoing and said return reference signals, said reference path including an outgoing path for transmitting said outgoing reference signal therealong and a return path for transmitting said return reference signal therealong, each said application module having a signal detecting site in said reference path.

5. A clock synchronizing apparatus as defined in claim 4, said reference path comprising a pair of electrical conductors having substantially equal lengths from any point thereon to said second site and being routed as a pair to the location of every application module to be synchronized.

6. A clock synchronizing apparatus as defined in claim 4, said reference path comprising a single electrical conductor routed from said first site to said second site and through to the location of every application module to be synchronized.

7. A clock synchronizing apparatus as defined in claim 4, said reference path being a free-space electromagnetic radiation path.

8. A clock synchronizing apparatus as defined in claim 7, said electromagnetic radiation path including radio, lightwave, infrared or other high frequency electromagnetic radiation paths.

9. A clock synchronizing apparatus as defined in claim 7; and further including means at each said application module for compensating for non-planar electromagnetic wave fronts.

10. A clock synchronizing apparatus as defined in claim 7 said detecting means including radio antennas optical, infra-red photodiodes, and/or lens assemblies.

11. A clock synchronizing apparatus as defined in claim 3, further including means at said second site for emitting said return reference signal upon receipt of said outgoing reference signal.

12. A clock synchronizing apparatus as defined in claim 3, further including means at said second site for re-transmitting said outgoing reference signal as said return reference signal from said second site towards said first site upon receipt of said outgoing reference signal.

13. A clock synchronizing apparatus as defined in claim 3, said detecting means including interval-halving circuit means.

14. A clock synchronizing apparatus as defined in claim 13, said interval-halving circuit including:
   first detector means for producing a output signal upon detecting an outgoing reference signal;
   second detector means for producing a second output signal upon detecting a return reference signal;
   means responsive to said first and second output signals for determining and storing the time interval between said first and second output signals; and
   means responsive to said first output signal for comparing a current time interval with an immediately preceding time interval and producing a reference phase output signal when said current time interval is one half said preceding time interval.

15. A clock synchronizing apparatus as defined in claim 14, said determining and storing means including:
   ramp generator means responsive to said first output signal for producing an output linear voltage rise; and
   sample and hold gate means responsive to said second output signal for acquiring and storing said output of said ramp generator means.

16. A clock synchronizing apparatus as defined in claim 15, said means for producing said reference phase output signal including a rising edge short pulse generator means.

17. A clock synchronizing apparatus as defined in claim 2, said outgoing and return reference signals being isolated square wave pulses.

18. A clock transmitting apparatus as defined in claim 17, wherein said transmitting means is for producing pulses at an interval greater than the round trip propagation time of said reference signals.

19. A clock synchronizing apparatus as defined in claim 3, said responsive means being a local clock phase lock loop circuit means for locking onto said local phase reference signal.

20. A clock synchronizing apparatus as defined in claim 3, said means responsive to said local phase reference signal comprising a phase lock loop circuit means including a voltage controlled oscillator having an input and an output for producing an oscillator output signal at a frequency and phase determined by a voltage applied to said oscillator input, and divider means for receiving said oscillator output signal for producing POSITIVE and INVERTED output signals;

said detector means including interval-halving circuit means operative to produce a pulse whose duration is equal to said time interval, means for receiving said POSITIVE and INVERTED output signals and said pulse for applying to said input of said voltage controlled oscillator a voltage proportional to the deviation of the transition between said POSITIVE and INVERTED outputs from the center point of said pulse.

21. A clock synchronizing apparatus as defined in claim 20, further including means for maintaining the voltage applied to said oscillator input at a constant value when there is no reference signal flowing between said detecting sites and said second site.

22. A clock synchronizing apparatus as defined in claim 20, said means for receiving said POSITIVE and INVERTED output signals and said predetermined output signal including:

first and second AND gates, each having a pair of inputs and an output, one input of each said AND gate being connected to the output of said detector means, the other input of one of said AND gates for receiving said POSITIVE output and the other input of the other of said AND gates for receiving said INVERTED output; and first and second switch means having a common output connected to said oscillator input, one of said switch means for receiving the output of one of said AND gates and the other of said switch means for receiving the output of the other of said AND gates.

23. A clock synchronizing apparatus as defined in claim 22, each said switch means being an FET transmission gate.

24. A clock synchronizing apparatus as defined in claim 23, further including means for maintaining the voltage applied to said oscillator input at a constant value when there is no reference pulse flowing between said detecting sites and said second site.

25. A clock synchronizing apparatus as defined in claim 24, said maintaining means being a capacitor.

26. A clock synchronizing apparatus as defined in claim 25, said detector means being a set-reset flip flop.

27. A clock synchronizing apparatus as defined in claim 3, further including means for transmitting a raw clock signal to each said application module.

28. A clock synchronizing apparatus as defined in claim 27, further including means defining a raw clock signal transmission path to each said application module.

29. A clock synchronizing apparatus as defined in claim 28, said means responsive to said local phase reference signal comprising a phase lock loop circuit means including a phase shifter having a first input for receiving said raw clock signal, a second input for receiving said local phase reference signal and an output for delivering a phase aligned clock signal, and divider means adapted to receive said oscillator output signal for producing POSITIVE and INVERTED output signals;

said detector means including interval-halving circuit means operative to produce a pulse whose duration is equal to said time interval, means for receiving said POSITIVE and INVERTED output signals and said pulse for applying to said input of said voltage controlled oscillator a voltage proportional to the deviation of the transition between said POSITIVE and INVERTED outputs from the center point of said pulse.

30. A clock synchronizing apparatus as defined in claim 29, said phase shifter being a digitally controllable, programmable phase shifter.

31. A clock synchronizing apparatus as defined in claim 29, said phase shifter being a continuously variable phase shifter.

32. A clock synchronizing apparatus as defined in claim 29, said means for receiving said POSITIVE and INVERTED output signals and said predetermined output signal including:

first and second AND gates, each having a pair of inputs and an output, one input of each said AND gate being connected to the output of said detector means, the other input of one of said AND gates for receiving said POSITIVE output and the other input of the other of said AND gates for receiving said INVERTED output; and first and second switch means having a common output connected to said oscillator input, one of said switch means for receiving the output of one of said AND gates and the other of said switch means for receiving the output of the other of said AND gates.

33. A clock synchronizing apparatus as defined in claim 32, each said switch means being an FET transmission gate.

34. A clock synchronizing apparatus as defined in claim 33, said detector means being a set-reset flip flop.

35. A clock synchronizing apparatus as defined in claim 3, said means responsive to said local phase reference signal comprising a phase lock loop circuit means including a voltage controlled oscillator having an input and an output for producing an oscillator clock output signal at a frequency and phase determined by a voltage applied to said oscillator input, and divide-by-N circuit means for receiving said oscillator output signal for delivering a divider output;

said detector means including interval-halving circuit means for controlling the voltage to applied to said oscillator, said interval-halving circuit means comprising:

first and second counter means, each said counter means having a clock input for receiving the output of said oscillator, said first counter means having a first count output, a first input for receiving said outgoing reference signal and a second input for receiving said divider output and being enabled to count oscillator clock outputs by said outgoing reference signal and being disabled by said divider output;

said second counter means having a second count output, a first input for receiving said divider output and a second input for receiving said return reference signal and being enabled to count oscillator outputs by said divider output and being disabled by said return reference signal;

comparator means for comparing said first and second count outputs producing a first output when said first count output is greater than said second count output and a second output when said second count output is greater than said first count output;

first buffer means responsive to said first comparator output for increasing the voltage applied to said oscillator whereby to increase the frequency of its output; and second buffer means responsive to said second comparator output for decreasing the voltage applied to said oscillator whereby to decrease the frequency of its output.

36. A clock synchronizing apparatus as defined in claim 3, said detecting means and said responsive means further including:

a fixed frequency oscillator for producing clock signals at a predetermined frequency;

a programmable divider circuit means for receiving said clock signals and having an output and divider first, second and third inputs;

divide-by-N circuit means for receiving said programmable divider circuit means output for delivering a divider output;

first and second counter means, each said counter means having a clock input for receiving said oscillator clock signals;

said first counter means having a first count output, a first input for receiving said outgoing reference signal and a second input for receiving said divider output and being enabled to count oscillator clock outputs by said outgoing reference signal and being disabled by said divider output;

said second counter means having a second count output, a first input for receiving said divider output and a second input for receiving said return reference signal and being enabled to count oscillator clock outputs by said divider output and being disabled by said return reference signal;

comparator means for comparing said first and second count outputs delivering a first output to said first divider input when said first count output is greater than said second count output, a second output to said second divider input when said second count output is greater than said first count output and a third output to said third divider input when said second count output is equal to said first count output;

said programmable divider circuit means being responsive to adjust the phase of its output to provide system-wide phase coherent synchronization of said application modules.

37. A method of phase synchronizing a plurality of spatially distributed application modules having synchronizing clocks requiring synchronization, said method comprising the steps of:

transmitting an outgoing reference signal from a first site to a second site and a return reference signal from said second site to said first site upon arrival of said outgoing reference signal at said second site; and detecting an outgoing reference signal and a corresponding return reference signal and producing a local phase reference signal approximately midway through the time interval required for said outgoing reference signal to travel from a signal detecting site at said application module to said second site and said return reference signal to travel from said second site to said signal detecting site.

38. A method as defined in claim 37, wherein said transmitting step includes transmitting a signal at a predetermined frequency wherein the period thereof is greater than the round trip propagation time of said signals.

39. A method as defined in claim 38, said predetermined frequency being less than or equal to $$f_{pulser} = v/2D$$

where D is the length of said outgoing path
$v = kc =$ propagation velocity; $k < 1$
$c =$ propagation velocity of light in a vacuum.

40. A method as defined in claim 37, said predetermined frequency being less than or equal to $$f_{pulser} = f_{hs}/[floor\{f_{hs}2D/v\}]$$

where:
$f_{hs}$ is the frequency of the high-speed system clock;
floor $\{arg\}$ is a function that takes the largest integer less than $\{arg\}$;
D is the length of said outgoing path;
$v = kc =$ propagation velocity;
$k < 1$; and
c is the propagation velocity of light in a vacuum.

41. A method as defined in claim 37, further including the step of regenerating each said reference pulse at said remote site.

42. A method as defined in claim 37, further including the step of terminating and regenerating each said reference signals at the location of each application module extracting synchronism from said signals.

43. A method of phase synchronizing a plurality of spatially distributed application modules having synchronizing clocks requiring synchronization, each said application modules being connected, at a predetermined site nearest said module, to an outgoing path and, at a corresponding site nearest said module, to a return path of a pulse reference path, said method comprising the steps of:

injecting reference pulses at a predetermined frequency into an injection site of said reference path such that said pulses travel along said outgoing path to a remote site and return to said injection site along said return path;

determining, for each said application module, the time interval for each said pulse to travel from said predetermined site to said corresponding site associated with said application module;

monitoring for each said application module the elapsed time interval for each said pulse to travel between said predetermined and corresponding sites associated with said application module;

producing for each said application module a local phase reference signal when said elapsed time interval is one-half a last determined one of said time intervals; and synchronizing said clock of each said application modules with said local phase reference signal.

44. A method as defined in claim 43, wherein the period of said predetermined frequency is greater than the round trip propagation time of said pulses along said outgoing and return paths of said reference path.

45. A method as defined in claim 43, said predetermined frequency being less than or equal to $$f_{pulser} = v/2D$$

where D is the length of said outgoing path
v=kc=propagation velocity; k<1
c=propagation velocity of light in a vacuum.

46. A method as defined in claim 43, said predetermined frequency being less than or equal to $$f_{pulser} = f_{hs}/\{floor\{f_{hs}2D/v\}\}$$

where:

$f_{hs}$ is the frequency of the high-speed system clock;
floor {arg} is a function that takes the largest integer less than {arg};
D is the length of said outgoing path;
v=kc=propagation velocity;
k<1; and
c is the propagation velocity of light in a vacuum.

47. A method as defined in claim 43, further including the step of regenerating each said reference pulse at said remote site.

48. A method as defined in claim 43, further including the step of terminating and regenerating each said reference pulses at the location of each application module extracting synchronism from said reference path.

49. A method as defined in claim 43, said outgoing and return paths having equal lengths from any point thereon to the ends thereof.

50. A clock synchronizing apparatus as defined in claim 8, further including means at each said application module for compensating for non-planar electromagnetic wave fronts.

51. A clock synchronizing apparatus as defined in claim 8, said detecting means including radio antennas, optical, infra-red photodiodes, and/or lens assemblies.

52. An electronic system comprising:
a signal source for providing an initial signal;
a plurality of receivers, each having a first and second input lead, each of said receivers requiring the use of an associated one of a plurality of locally generated signals, each of said plurality of locally generated signals corresponding to said initial signal and delayed from said initial signal by a a signal path having an end for receiving said initial signal, each of said first input leads of said plurality of receivers being connected to said signal path at an associated one of a first plurality of locations along said signal path such that each of said receivers has an associated first propagation delay between said source and said location, such that said first propagation delays are not equal, and each of said second input leads of said plurality of receivers being connected to said signal path at an associated one of a second plurality of locations along said signal path such that each of said receivers has an associated second propagation delay between said source and said location, such that said second propagation delays are not equal; and a plurality of means, each association with one of said receivers for combining said signals on said first and second input leads in order to generate a locally generated signal corresponding to said initial signal and having a propagation delay from said initial signal which is equal to the average of said first propagation delay and said second propagation delay associated with said receiver.

53. A system as in claim 52 wherein, for each receiver, the sum of the distances between said source and said first and second associated with said receivers is substantially equal to such sum associated with each other receiver.

54. Apparatus for providing a signal comprising:
a first input lead for receiving a first signal corresponding to an initial signal and delayed from said initial signal by a first propagation delay;
a second input lead for receiving a second input signal corresponding to said initial signal and delayed from said initial signal by a second propagation delay;
an output lead for providing a locally generated signal corresponding to said initial signal and delayed from said initial signal by a third propagation delay which is a function of said first and second propagation delays;
a first phase detector for providing a first phase comparison signal indicative of the phase relationship between said first input signal and said locally generated signal;
a second phase detector for providing a second phase comparison signal indicative of the phase relationship between said second input signal and said locally generated signal;
means for combining said phase comparison signal to provide a combined phase comparison signal; and
a voltage controlled oscillator for providing said locally generated signal in response to said combined comparison signal.

* * * * *

UNITED STATES PATENT AND TRADEMARK OFFICE
CERTIFICATE OF CORRECTION

PATENT NO. : 5,361,277
DATED : November 1, 1994
INVENTOR(S) : Wayne D. Grover

It is certified that error appears in the above-indentified patent and that said Letters Patent is hereby corrected as shown below:

Claim 9, Col. 22, line 26, delete "; and" insert --,--

Claim 10, Col. 22, line 30, after "7" insert --,--

Claim 46, Col. 27, line 26, after "floor" delete "[" insert -- { --

Claim 52, Col. 28, line 2, after "a" insert --predefined time--

Signed and Sealed this

Third Day of October, 1995

Attest:

BRUCE LEHMAN

*Attesting Officer*   *Commissioner of Patents and Trademarks*